(12) United States Patent
Woo et al.

(10) Patent No.: US 12,598,873 B2
(45) Date of Patent: Apr. 7, 2026

(54) DISPLAY PANEL AND ELECTRONIC DEVICE INCLUDING THE SAME

(71) Applicant: Samsung Display Co., Ltd., Yongin-si (KR)

(72) Inventors: Minwoo Woo, Seoul (KR); Sungho Kim, Suwon-si (KR); Seokje Seong, Seongnam-si (KR); Jinsung An, Gwacheon-si (KR); Haeyoung Yun, Hwaseong-si (KR); Seunghyun Lee, Anyang-si (KR); Wangwoo Lee, Osan-si (KR); Jiseon Lee, Hwaseong-si (KR); Yoon-Jong Cho, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1013 days.

(21) Appl. No.: 17/713,237

(22) Filed: Apr. 5, 2022

(65) Prior Publication Data

US 2022/0384764 A1    Dec. 1, 2022

(30) Foreign Application Priority Data

May 25, 2021    (KR) ........................ 10-2021-0067056

(51) Int. Cl.
H10K 59/131    (2023.01)
H10K 59/122    (2023.01)
(Continued)

(52) U.S. Cl.
CPC ......... H10K 59/131 (2023.02); H10K 59/122 (2023.02); H10K 59/126 (2023.02);
(Continued)

(58) Field of Classification Search
CPC .... H10K 59/131; H10K 59/40; H10K 59/122; H10K 50/858; H10K 59/38;
(Continued)

(56) References Cited

U.S. PATENT DOCUMENTS 7,969,087 B2    6/2011   Hwang et al.
9,391,127 B2    7/2016   Song et al.
(Continued)

FOREIGN PATENT DOCUMENTS

KR    10-2009-0106099      10/2009
KR    10-2015-0071536      6/2015
(Continued)

*Primary Examiner* — Jacob Y Choi
*Assistant Examiner* — Neil R Prasad
(74) *Attorney, Agent, or Firm* — Sughrue Mion, PLLC

(57)    ABSTRACT

A display panel includes a base layer, a circuit layer disposed on the base layer, a light-emitting element layer disposed on the circuit layer and including a light-emitting element having a pixel electrode, a light-emitting layer disposed on the pixel electrode, and a common electrode disposed on the light-emitting layer, an encapsulation layer disposed on the light-emitting element layer, and a pattern disposed between the circuit layer and the light-emitting element layer. At least a portion of the pattern may be disposed in a region adjacent to the light-emitting element, with respect to a plan view of the display panel.

20 Claims, 14 Drawing Sheets

(51) Int. Cl.
    *H10K 59/126*     (2023.01)
    *H10K 59/38*     (2023.01)
    *H10K 59/40*     (2023.01)
    *H10K 59/80*     (2023.01)

(52) U.S. Cl.
    CPC ............. *H10K 59/38* (2023.02); *H10K 59/40* (2023.02); *H10K 59/8731* (2023.02); *H10K 59/879* (2023.02); *H10K 59/8791* (2023.02)

(58) Field of Classification Search
    CPC .............. H10K 59/126; H10K 50/844; H10K 59/8791; H10K 59/879; H10K 59/8731
    See application file for complete search history.

(56) References Cited

U.S. PATENT DOCUMENTS

| | | | |
|---|---|---|---|
| 10,163,990 B2 | 12/2018 | Chung et al. | |
| 11,335,764 B2 | 5/2022 | Her et al. | |

| | | | | |
|---|---|---|---|---|
| 2003/0127651 | A1* | 7/2003 | Murakami | ........... H10K 59/873 |
| | | | | 313/500 |
| 2005/0062409 | A1* | 3/2005 | Yamazaki | .......... H10K 59/8051 |
| | | | | 257/E27.111 |
| 2016/0005797 | A1* | 1/2016 | Huang | .................. H10K 50/81 |
| | | | | 257/40 |
| 2017/0176800 | A1* | 6/2017 | Chen | ................... G02F 1/13363 |
| 2020/0373372 | A1* | 11/2020 | Chung | .............. H10K 59/8792 |
| 2020/0403055 | A1 | 12/2020 | Jung et al. | |
| 2021/0159445 | A1* | 5/2021 | Sim | ..................... H10K 50/818 |

FOREIGN PATENT DOCUMENTS

| | | |
|---|---|---|
| KR | 10-2017-0113734 | 10/2017 |
| KR | 10-2019-0119960 | 10/2019 |
| KR | 10-2020-0135637 | 12/2020 |
| KR | 10-2020-0144903 | 12/2020 |

* cited by examiner

FIG. 7B

DISPLAY PANEL AND ELECTRONIC DEVICE INCLUDING THE SAME

CROSS-REFERENCE TO RELATED APPLICATIONS

This application claims priority from and the benefit of Korean Patent Application No. 10-2021-0067056, filed on May 25, 2021, which is hereby incorporated by reference for all purposes as if fully set forth herein.

BACKGROUND

Field

The present disclosure herein relates to a display panel having a region with improved light transmittance, and an electronic device including the same.

Discussion of the Background

An electronic device may be a device composed of various electronic components such as a display panel, and an electronic module. The electronic module may include a camera, an infrared detection sensor, a proximity sensor, or the like. The electronic module may be disposed under the display panel. The light transmittance of one region of the display panel may be higher than the light transmittance of another region of the display panel. The electronic module may receive an external input through one region of the display panel, or provide an output through one region of the display panel.

The above information disclosed in this Background section is only for understanding of the background of the inventive concepts, and, therefore, it may contain information that does not constitute prior art.

SUMMARY

Devices constructed according to embodiments of the invention are capable of improved image display.

Embodiments described hereinbelow provide a display panel having a region with improved light transmittance.

Embodiments also provide for an electronic device that provides a high-quality image and has improved quality of a signal obtained or received by an electronic module.

Additional features of the inventive concepts will be set forth in the description which follows, and in part will be apparent from the description, or may be learned by practice of the inventive concepts.

An embodiment provides a display panel including: a base layer; a circuit layer disposed on the base layer; a light-emitting element layer disposed on the circuit layer, and including a light-emitting element having a pixel electrode, a light-emitting element layer disposed on the pixel electrode, and a common electrode disposed on the light-emitting layer; an encapsulation layer disposed on the light-emitting element layer; and a pattern disposed between the circuit layer and the light-emitting element layer, wherein at least a portion of the pattern may be disposed in a region adjacent to the light-emitting element, with respect to a plan view of the display panel.

In an embodiment, an area of the pattern may be greater than an area of the pixel electrode.

In an embodiment, at least another portion of the pattern may be disposed between the pixel electrode and the circuit layer.

In an embodiment, the circuit layer may include an upper insulating layer in contact with the pattern, and a refractive index of the pattern and a refractive index of the upper insulating layer are different from each other.

In an embodiment, the encapsulation layer may include an organic layer, and a refractive index of the pattern is different from a refractive index of the organic layer.

In an embodiment, the pattern may include a transparent conductive oxide or an inorganic substance.

In an embodiment, a phase of first light incident on the circuit layer after passing through the pattern, and a phase of second light incident on the circuit layer without passing through the pattern may be different from each other.

In an embodiment, a difference between the phase of the first light and the phase of the second light may be closer to $(2n-1)\pi$ radians when the first light and the second light each have a red-light wavelength band than when the first light and the second light each have a green- or blue-light wavelength band.

In an embodiment, the light-emitting element layer may further include a pixel defining pattern disposed on the pixel electrode and overlapping a portion of the pixel electrode, and the pixel may protrude from the pixel defining pattern, with respect to a plan view of the display panel.

In an embodiment, the pixel defining pattern may include a first edge overlapping the pixel electrode, and a second edge overlapping the pattern while surrounding the first edge.

In an embodiment, an edge of the pattern may surround the second edge.

In an embodiment, an element region in which the light-emitting element may be disposed and a transmission region adjacent to the element region are defined in the light-emitting element layer, and at least a portion of the pattern may be disposed in the transmission region.

In an embodiment, a portion of the transmission region may not overlap the pattern.

In an embodiment, an edge of the pixel electrode and an edge of the pattern each may have a curve.

In an embodiment, an electronic device may include a display panel in which an auxiliary display region having an element region and a transmission region defined therein, and a main display region adjacent to the auxiliary display region are defined, wherein the display panel may include a base layer; a circuit layer disposed on the base layer; a phase shift pattern disposed on the circuit layer and disposed in the auxiliary display region; a first light-emitting element disposed in the auxiliary display region and including a first pixel electrode; and a second light-emitting element disposed in the main display region and including a second pixel electrode, and wherein the first pixel electrode may overlap the element region, and at least a portion of the phase shift pattern may overlap the transmission region.

In an embodiment, the phase shift pattern may be disposed between the first pixel electrode and the circuit layer, and an area of the phase shift pattern may be greater than an area of the pixel electrode.

In an embodiment, the circuit layer may include an upper insulating layer in contact with the phase shift pattern, and a refractive index of the phase shift pattern and a refractive index of the upper insulating layer may be different from each other.

In an embodiment, a phase of first light incident on the circuit layer after passing through the phase shift pattern, and a phase of second light incident on the circuit layer without passing through the phase shift pattern are different from each other, and the difference between the phase of the first light and the phase of the second light may be closer to $(2n-1)\pi$ radians when the first light and the second light each have a red-light wavelength band than when the first light and the second light each have a green- or blue-light wavelength band.

In an embodiment, the electronic device may further include an electronic module overlapping the auxiliary display region.

In an embodiment, the first pixel electrode may be provided in plurality and the second pixel electrode may be provided in plurality; and a distance between two first pixel electrodes which are most adjacent to each other among the plurality of the first pixel electrodes may be greater than a distance between two second pixel electrodes which are most adjacent to each other among the plurality of the second pixel electrodes.

It is to be understood that both the foregoing general description and the following detailed description are illustrative and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate embodiments of the invention, and together with the description serve to explain the inventive concepts.

FIG. 7B is a cross-sectional view of a display module according to an embodiment.

DETAILED DESCRIPTION

Figure 1:
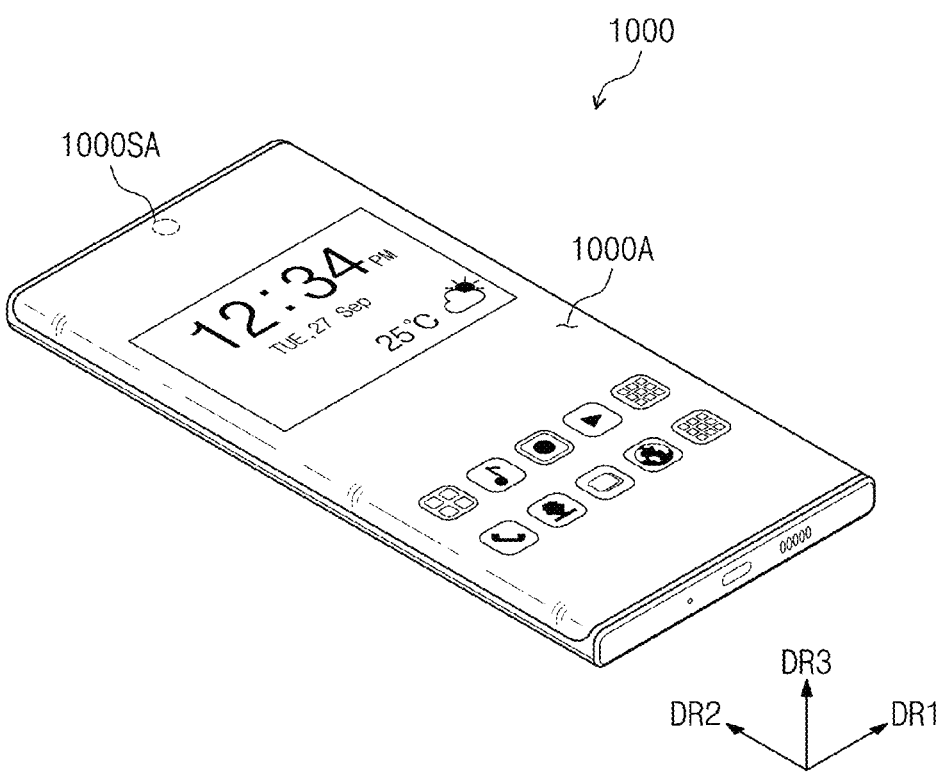
FIG. 1 is a perspective view of an electronic device according to an embodiment of the inventive concepts.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the inventive concepts will be described with reference to the accompanying drawings.

FIG. 1 is a perspective view of an electronic device according to an embodiment of the inventive concepts.

Referring to FIG. 1, an electronic device 1000 may be activated in response to an electrical signal. For example, the electronic device 1000 may be a mobile phone, a tablet computer, a monitor, a television, a car navigation system, a game console, or a wearable device, but is not limited thereto. FIG. 1 illustrates that the electronic device 1000 is a mobile phone.

The electronic device 1000 may display an image through a display region 1000A. The display region 1000A may include a plane defined by a first direction DR1 and a second direction DR2. The display region 1000A may further include curved surfaces respectively bent from at least two sides of the plane. However, the shape of the display region 1000A is not limited thereto. For example, the display region 1000A may include only the plane, and the display region 1000A may further include two or more curved surfaces, for example, four curved surfaces bent from four sides of the plane.

A sensing region 1000SA may be defined in the display region 1000A of the electronic device 1000. Although one sensing region 1000SA is illustrated in FIG. 1, the number of sensing regions 1000SA is not limited thereto. The sensing region 1000SA may be a portion of the display region 1000A. Accordingly, the electronic device 1000 may display an image through the sensing region 1000SA.

An electronic module may be disposed in a region overlapping the sensing region 1000SA. The electronic module may receive an external input transmitted through the sensing region 1000SA or may provide an output through the sensing region 1000SA. For example, the electronic module may be a camera module, a distance measuring sensor such as a proximity sensor, a sensor that recognizes a part of the user's body (e.g., fingerprint, iris, or face), or a small lamp that outputs light, but is not particularly limited thereto.

The thickness direction of the electronic device 1000 may be parallel to a third direction DR3 intersecting the first direction DR1 and the second direction DR2. Accordingly, the front surface (or upper surface) and the rear surface (or lower surface) of each of the members constituting the electronic device 1000 may be defined based on the third direction DR3.

Figure 2:
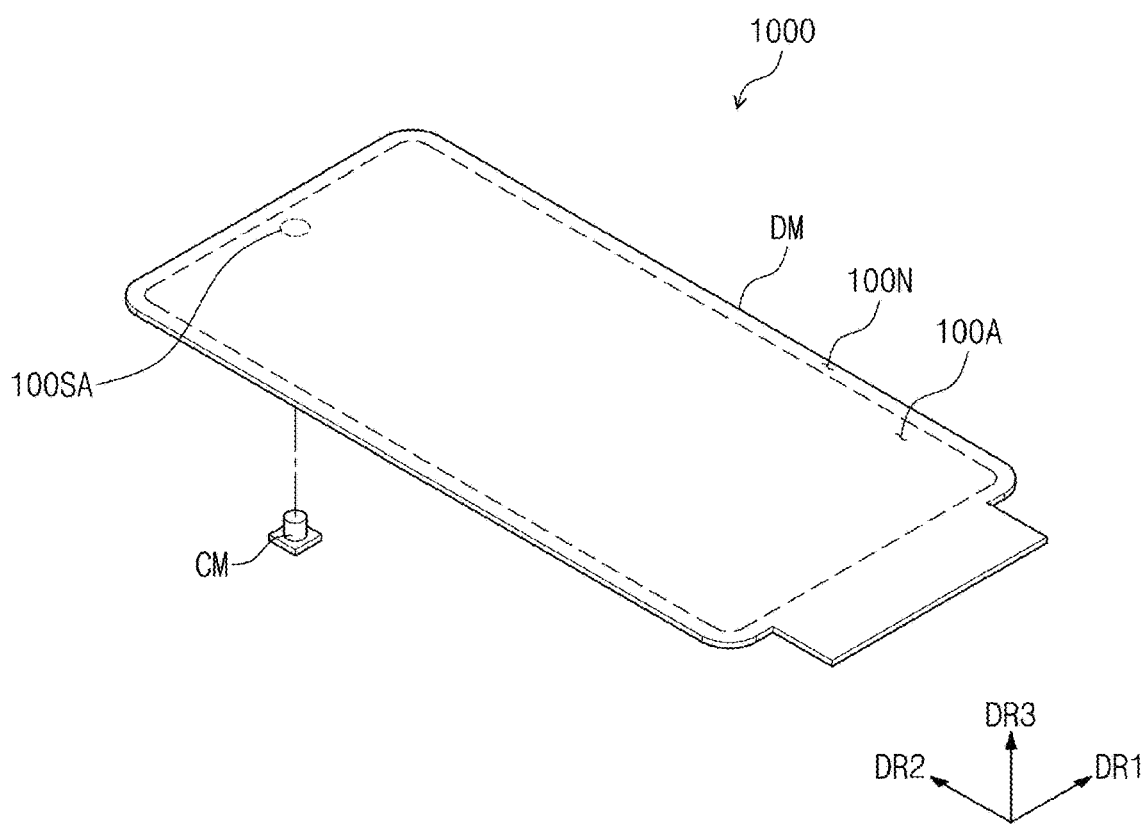
FIG. 2 is an exploded perspective view illustrating some components of an electronic device according to an embodiment.

FIG. 2 is an exploded perspective view illustrating some components of an electronic device according to an embodiment of the inventive concepts.

Referring to FIG. 2, the electronic device 1000 may include a display module DM and an electronic module CM. The display module DM may be configured to generate an image and sense an input applied from the outside. The electronic module CM may be disposed under the display module DM, and may be, for example, a camera module. The display module DM may be referred to as a first electronic module, and the electronic module CM may be referred to as a second electronic module.

A display region 100A and a peripheral region 100N may be defined in the display module DM. The display region 100A may correspond to the display region 1000A illustrated in FIG. 1. Some regions of the display module DM may have a higher light transmittance than other regions, and may be defined as a sensing region 100SA. The sensing region 100SA may be a portion of the display region 100A. That is, the sensing region 100SA displays an image, and may allow an external input provided to the electronic module CM and/or an output from the electronic module CM to be transmitted therethrough.

Figure 3:
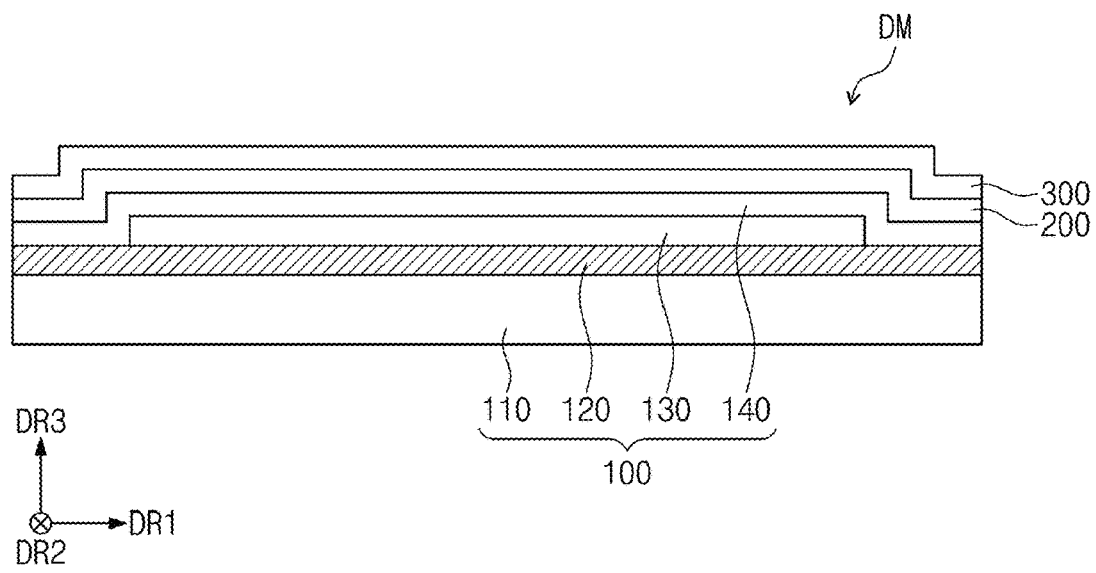
FIG. 3 is a cross-sectional view of a display module according to an embodiment.

FIG. 3 is a cross-sectional view of a display module according to an embodiment of the inventive concepts.

Referring to FIG. 3, the display module DM may include a display panel 100, a sensor layer 200, and an anti-reflection layer 300.

The display panel 100 may be configured to substantially generate an image. The display panel 100 may be a luminescent display panel. For example, the display panel 100 may be an organic light-emitting display panel, an inorganic light-emitting display panel, a quantum dot display panel, a micro-LED display panel, or a nano-LED display panel. The display panel 100 may be referred to as a display layer.

The display panel 100 may include a base layer 110, a circuit layer 120, a light-emitting element layer 130, and an encapsulation layer 140. The base layer 110 may be a member that provides a base surface on which the circuit layer 120 is disposed. The base layer 110 may be a rigid substrate or a flexible substrate capable of bending, folding, rolling, or the like. The base layer 110 may be a glass substrate, a metal substrate, or a polymer substrate. However, embodiments are not limited thereto, and the base layer 110 may be an inorganic layer, an organic layer, or a composite material layer.

The base layer 110 may have a multi-layer structure. For example, the base layer 110 may include a first synthetic resin layer, an intermediate layer having a multi-layer or a single-layer structure, and a second synthetic resin layer disposed on the intermediate layer. The intermediate layer may be referred to as a base barrier layer. The intermediate layer may include a silicon oxide ($SiO_x$) layer, and an amorphous silicon (a-Si) layer disposed on the silicon oxide layer, but is not limited thereto. For example, the intermediate layer may include at least one of a silicon oxide layer, a silicon nitride layer, a silicon oxynitride layer, or an amorphous silicon layer.

Each of the first and second synthetic resin layers may include a polyimide-based resin. In addition, each of the first and second synthetic resin layers may include at least one of an acrylic resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In the present specification, "~~"-based resin means including a functional group of "~~"

The circuit layer 120 may be disposed on the base layer 110. The circuit layer 120 may include an insulating layer, a semiconductor pattern, a conductive pattern, and a signal line. An insulating layer, a semiconductor layer, and a conductive layer are formed on the base layer 110 by coating, deposition, etc., and then, the insulating layer, the semiconductor layer, and the conductive layer may be selectively patterned through a plurality of photolithographic processes. Thereafter, a semiconductor pattern, a conductive pattern, and a signal line included in the circuit layer 120 may be formed.

The light-emitting element layer 130 may be disposed on the circuit layer 120. The light-emitting element layer 130 may include a light-emitting element. For example, the light-emitting element layer 130 may include an organic light-emitting material, an inorganic light-emitting material, an organic-inorganic light-emitting material, a quantum dot, a quantum rod, a micro-LED, or a nano-LED.

The encapsulation layer 140 may be disposed on the light-emitting element layer 130. The encapsulation layer 140 may protect the light-emitting element layer 130 from foreign substances such as moisture, oxygen, and dust particles.

The sensor layer 200 may be disposed on the display panel 100. The sensor layer 200 may detect an external input applied from the outside. The external input may be a user's input. The user's input may include various types of external inputs, such as a part of the user's body, light, heat, pen, or pressure.

The sensor layer 200 may be formed on the display panel 100 through a continuous process. In this case, the sensor layer 200 may be expressed as being directly disposed on the display panel 100. The wording that the sensor layer is directly disposed on the display panel may mean that a third component is not disposed between the sensor layer 200 and the display panel 100. That is, a separate adhesive member may not be disposed between the sensor layer 200 and the display panel 100. Alternatively, in one embodiment, the sensor layer 200 may be coupled to the display panel 100 through an adhesive member. The adhesive member may include a conventional boning agent or adhesive. The anti-reflection layer 300 may be disposed on the sensor layer 200. The anti-reflection layer 300 may reduce the reflectance of external light incident from the outside of the display module DM. The anti-reflection layer 300 may be formed on the sensor layer 200 through a continuous process.

The anti-reflection layer 300 may include color filters. The color filters may have a predetermined arrangement. For example, the color filters may be arranged in consideration of emission colors of pixels included in the display panel 100. In addition, the anti-reflection layer 300 may further include a black matrix adjacent to the color filters.

In another embodiment, the anti-reflection layer 300 may include a stretchable synthetic resin film. For example, the anti-reflection layer 300 may be provided by dyeing an iodine compound on a polyvinyl alcohol film (PVA film). In this case, a portion of the anti-reflection layer 300 overlapping the sensing region 100SA (see FIG. 2) may be discolored. Alternatively, a portion of the anti-reflection layer 300 overlapping the sensing region 100SA (see FIG. 2) may be removed.

In an embodiment, the sensor layer 200 may be omitted in some implementations. In this case, the anti-reflection layer 300 may be disposed on the display panel 100. For example, the anti-reflection layer 300 may be directly formed on the display panel 100 through a continuous process.

In an embodiment, the positions of the sensor layer 200 and the anti-reflection layer 300 may be changed. For example, the anti-reflection layer 300 may be disposed between the display panel 100 and the sensor layer 200.

In an embodiment, the display module DM may further include an optical layer disposed on the anti-reflection layer 300. For example, the optical layer may be formed on the anti-reflection layer 300 through a continuous process. The optical layer may control the direction of the light incident from the display panel 100 to improve the front luminance of the display module DM. For example, the optical layer may include an organic insulating layer in which openings are defined to respectively correspond to light-emitting regions of pixels included in the display panel 100, and a high-refractive-index layer that covers the organic insulating layer and fills the openings. The high-refractive-index layer may have a higher refractive index than the organic insulating layer.

Figure 4:
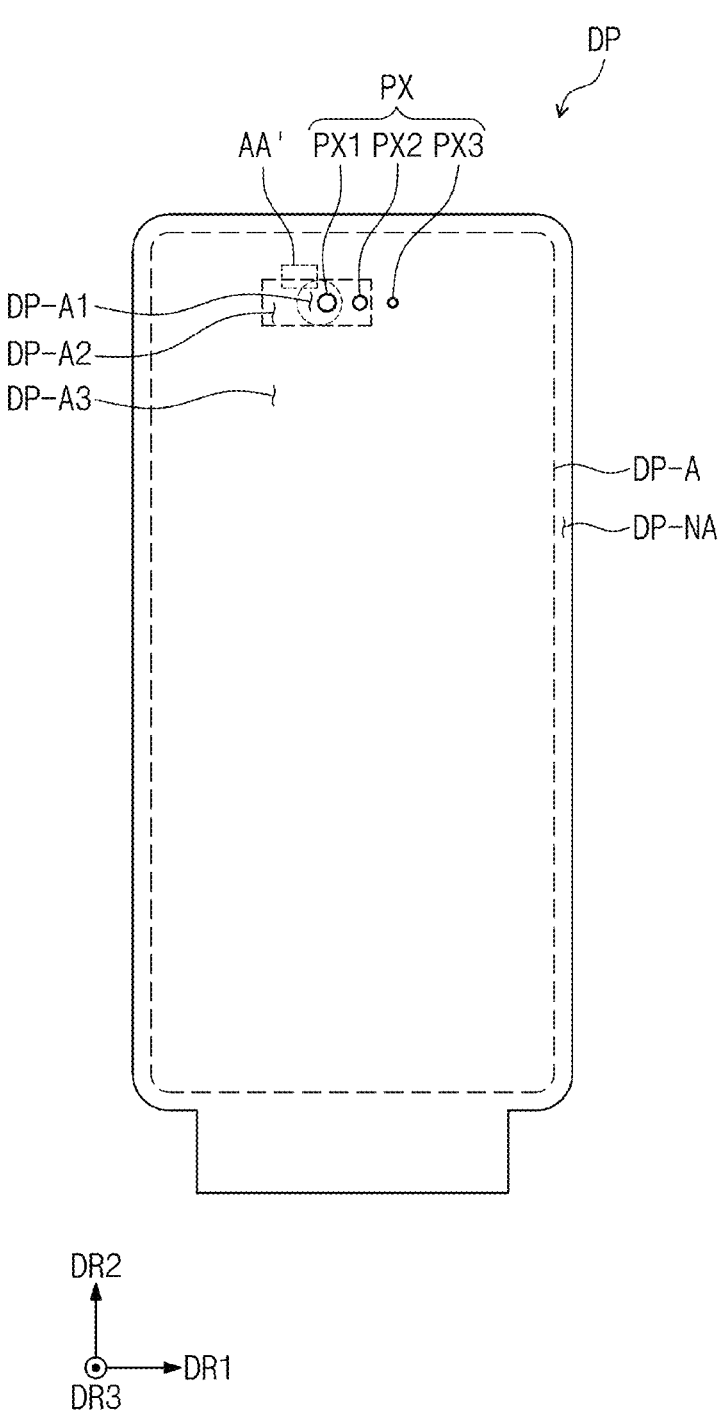
FIG. 4 is a plan view of a display panel according to an embodiment.
Figure 5:
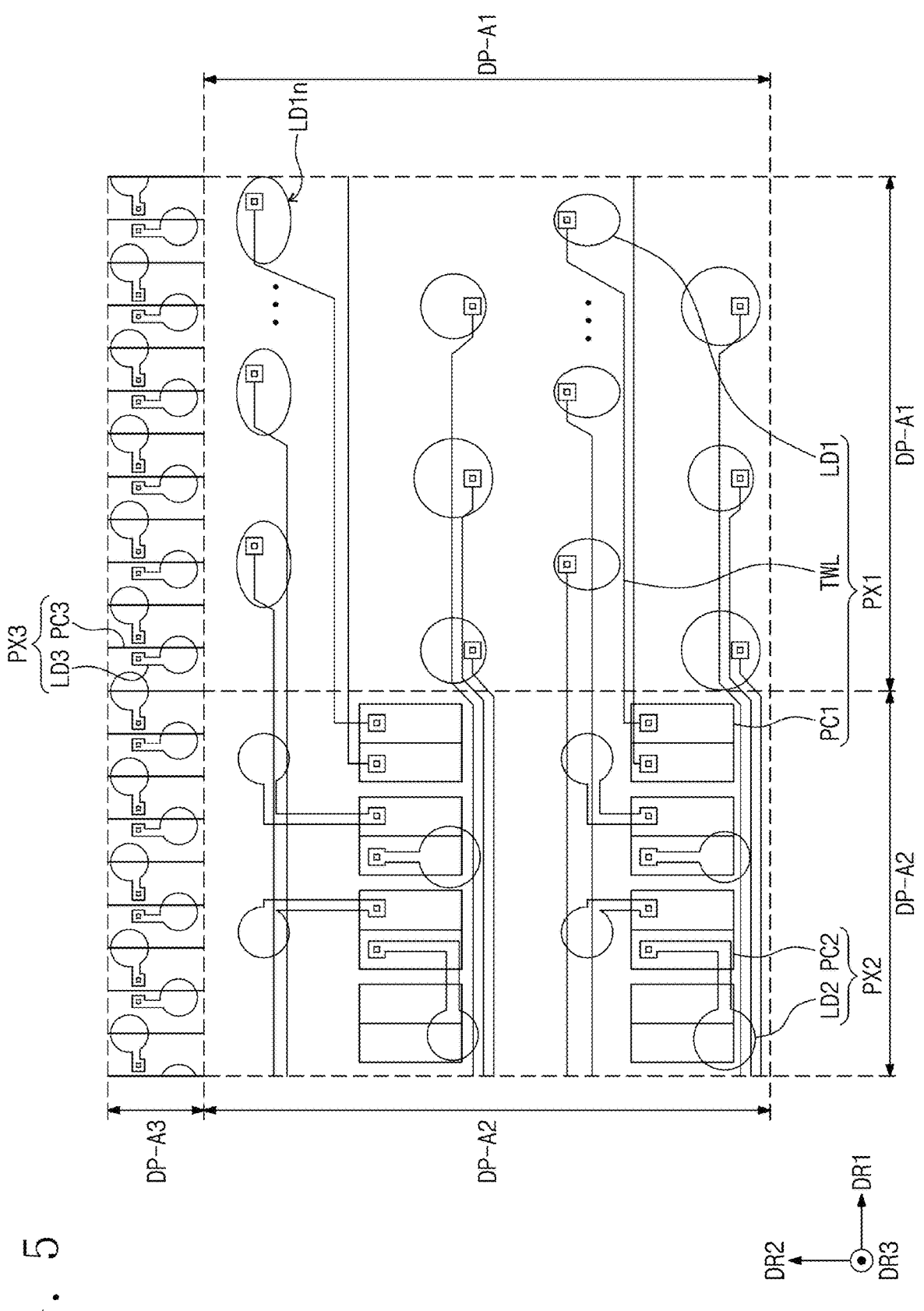
FIG. 5 is a plan view in which a region AA' of FIG. 4 is enlarged.

FIG. 4 is a plan view of a display panel according to an embodiment of the inventive concepts. FIG. 5 is a plan view in which a region AA' of FIG. 4 is enlarged.

Referring to FIGS. 4 and 5, the display panel 100 may include a display region DP-A and a peripheral region DP-NA. The peripheral region DP-NA may be adjacent to the display region DP-A and surround at least a portion of the display region DP-A.

The display region DP-A may include a first region DP-A1, a second region DP-A2, and a third region DP-A3. The first region DP-A1 may be referred to as a component region, the second region DP-A2 may be referred to as an intermediate region or transition region, and the third region DP-A3 may be referred to as a main display region or general display region. The first region DP-A1 and the second region DP-A2 may be referred to as auxiliary display regions.

The display panel 100 may include a plurality of pixels PX. The plurality of pixels PX may include a first pixel PX1 that emits light from the first region DP-A1, a second pixel PX2 that emits light from the second region DP-A2, and a third pixel PX3 that emits light from the third region DP-A3.

Each of the first pixel PX1, the second pixel PX2, and the third pixel PX3 may be provided in plurality. In this case, the first to third pixels PX1, PX2, and PX3 may respectively include red pixels, green pixels, and blue pixels, and may further include white pixels according to another embodiment.

The first pixel PX1 may include a first light-emitting element LD1 and a first pixel circuit PC1 that drives the first light-emitting element LD1, the second pixel PX2 may include a second light-emitting element LD2 and a second pixel circuit PC2 that drives the second light-emitting element LD2, and the third pixel PX3 may include a third light-emitting element LD3 and a third pixel circuit PC3 that drives the third light-emitting element LD3. The positions of the first pixel PX1, the second pixel PX2, and the third pixel PX3 illustrated in FIG. 4 respectively correspond to the positions of the first, second, and third light-emitting elements LD1, LD2, and LD3.

The first region DP-A1 may overlap with or correspond to the sensing region 1000SA illustrated in FIG. 1. That is, the first region DP-A1 may be provided in a region overlapping the electronic module CM (see FIG. 2) on a plane. For example, an external input (for example, light) may be provided to the electronic module CM through the first region DP-A1, and an output from the electronic module CM may be emitted to the outside through the first region DP-A1. In this embodiment, the first region DP-A1 is illustrated to have a circular shape, but may have various shapes such as a polygon, an ellipse, a figure having at least one curved side, or an irregular shape, and is not limited to any one embodiment.

In order to secure the area of the transmission region, a fewer number of pixels may be provided in the first region DP-A1 than in third region DP-A3. A region of the first region DP-A1 in which the first light-emitting element LD1 is not disposed may be defined as a transmission region. For example, a region of the first region DP-A1 in which the first pixel electrode of the first light-emitting element LD1 and the pixel defining pattern that surrounds the first pixel electrode are not disposed may be defined as a transmission region.

Within a unit area or the same area, the number of first pixels PX1 disposed in the first region DP-A1 may be less than the number of third pixels PX3 disposed in the third region DP-A3. For example, the resolution of the first region DP-A1 may be about ½, ⅜, ⅓, ¼, ⅖, ⅛, ⅑, ¹⁄₁₆, or the like of the resolution of the third region DP-A3. For example, the resolution of the third region DP-A3 may be about 400 ppi or more, and the resolution of the first region DP-A1 may be about 200 ppi or about 100 ppi. However, this is merely an example and thus embodiments are not particularly limited thereto.

The first pixel circuit PC1 of the first pixel PX1 may not be disposed in the first region DP-A1. For example, the first pixel circuit PC1 may be disposed in the second region DP-A2 or the peripheral region DP-NA. In this case, the light transmittance of the first region DP-A1 may be higher than that in a case where the first pixel circuit PC1 is disposed in the first region DP-A1.

The first light-emitting element LD1 and the first pixel circuit PC1 may be electrically connected to each other through a connection line TWL. The connection line TWL may overlap the transmission region of the first region DP-A1. The connection line TWL may include a transparent conductive line. The transparent conductive line may contain a transparent conductive material or a light transmission material. For example, the connection line TWL may be formed of a transparent conductive oxide (TCO) film such as indium tin oxide (ITO), indium zinc oxide (IZO), indium gallium zinc oxide (IGZO), zinc oxide (ZnO) or indium oxide ($In_2O_3$).

The second region DP-A2 is adjacent to the first region DP-A1. The second region DP-A2 may surround at least a portion of the first region DP-A1. The second region DP-A2 may have a lower light transmittance than the first region DP-A1. In this embodiment, the second region DP-A2 may be spaced apart from the peripheral region DP-NA. However, embodiments are not limited thereto, and the second region DP-A2 may be in contact with the peripheral region DP-NA.

The first pixel circuit PC1 of the first pixel PX1, the second light-emitting element LD2, and the second pixel circuit PC2 may be disposed in the second region DP-A2. Accordingly, the light transmittance of the second region DP-A2 may be lower than the light transmittance of the first region DP-A1. In addition, the first pixel circuit PC1 of the first pixel PX1 is disposed in the second region DP-A2, and therefore, within a unit area or the same area, the number of second pixels PX2 disposed in the second region DP-A2 may be less than the number of third pixels PX3 disposed in the third region DP-A3. The resolution of the image displayed on the second region DP-A2 may be lower than the resolution of the image displayed on the third region DP-A3.

The third region DP-A3 is adjacent to the second region DP-A2. The third region DP-A3 may be defined as a region having a light transmittance lower than that of the first region DP-A1. The third light-emitting element LD3 and the third pixel circuit PC3 may be disposed in the third region DP-A3.

The first light-emitting element LD1$n$ disposed in the first region DP-A1 which is most adjacent to the third region DP-A3 may have a circular shape having a greater width in a specific direction in order to secure a distance to the third light-emitting element LD3 disposed in the third region DP-A3. For example, when the first region DP-A1 is adjacent to the third region DP-A3 in the second direction DR2, the first light-emitting element LD1$n$ may have a greater width in the first direction DR1 than a width in the second direction DR2.

Each of the first light-emitting element LD1, the second light-emitting element LD2, and the third light-emitting element LD3 may be provided in plurality. A distance between two first light-emitting elements most adjacent to each other among the first light-emitting elements LD1 may be greater than a distance between two third light-emitting elements most adjacent to each other among the third light-emitting elements LD3. In addition, a distance between two second light-emitting elements most adjacent to each other among the second light-emitting elements LD2 may be greater than the distance between the two third light-emitting elements most adjacent to each other among the third light-emitting elements LD3.

The first, second and third light-emitting elements LD1, LD2, and LD3 illustrated in FIG. 5 may respectively correspond to the planar shapes of the first pixel electrode AE1 (see FIG. 7B) of the first light-emitting element LD1, the second pixel electrode AE2 (see FIG. 7B) of the second light-emitting element LD2, and the third pixel electrode AE3 (see FIG. 7A) of the third light-emitting element LD3. The area of the first pixel electrode AE1 (see FIG. 8) may be larger than the area of the third pixel electrode AE3 (see FIG. 7).

Figure 6:
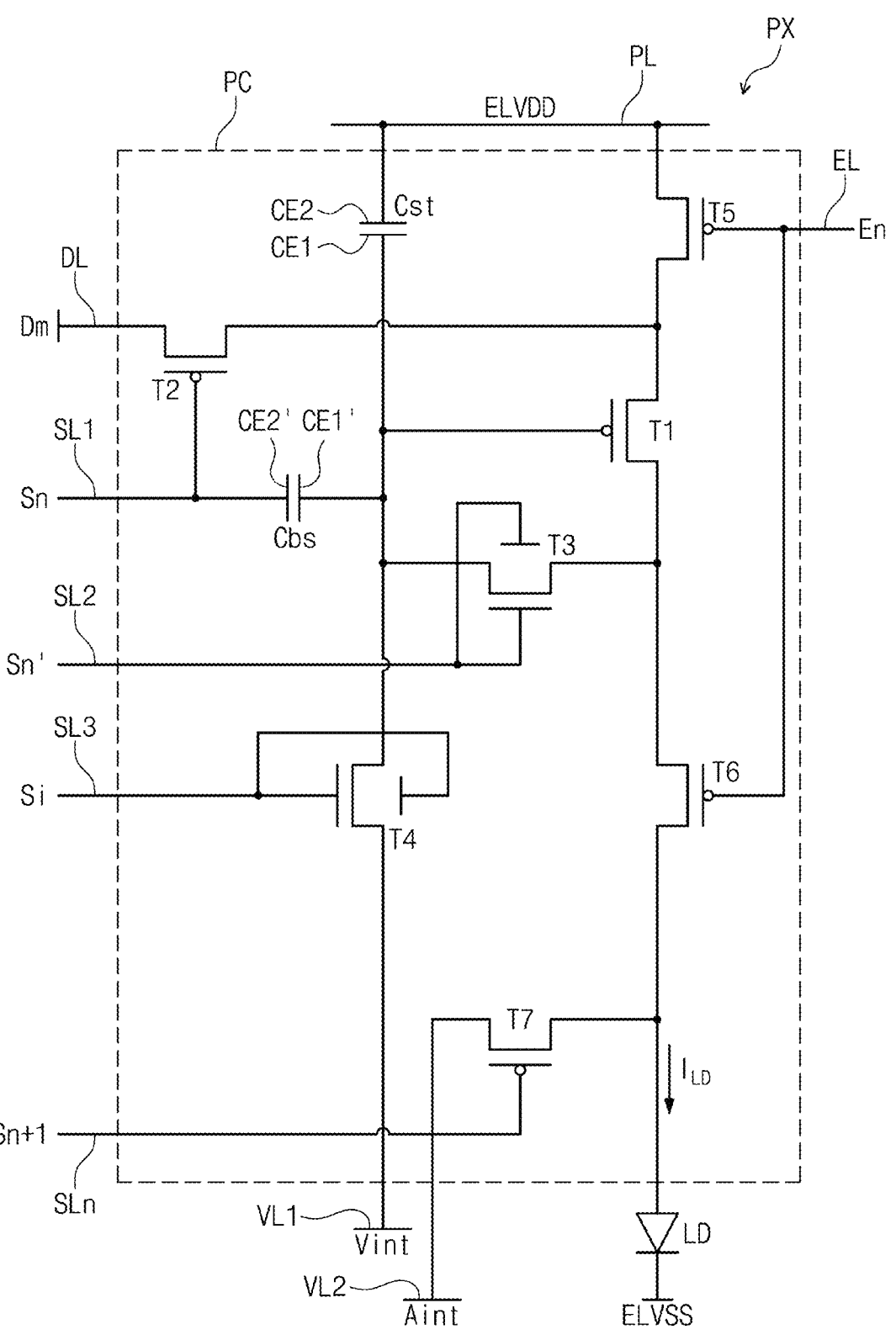
FIG. 6 is an equivalent circuit diagram of a pixel according to an embodiment.

FIG. 6 is an equivalent circuit diagram of a pixel according to an embodiment of the inventive concepts.

Referring to FIG. 6, an equivalent circuit diagram of one-pixel PX among the plurality of pixels PX is illustrated. The pixel PX illustrated in FIG. 6 may be a first pixel PX1 (see FIG. 4), a second pixel PX2 (see FIG. 4), or a third pixel PX3 (see FIG. 4). The pixel PX may include a light-emitting element LD and a pixel circuit PC. The light-emitting element LD may be included in the light-emitting element layer 130 of FIG. 3, and the pixel circuit PC may be included in the circuit layer 120 of FIG. 3.

The pixel circuit PC may include a plurality of thin film transistors T1 to T7 and a storage capacitor Cst. The plurality of thin film transistors T1 to T7 and the storage capacitor Cst may be electrically connected to signal lines SL1, SL2, SL3, SLn, EL, and DL, a first initialization voltage line VL1, a second initialization voltage line VL2 (or anode initialization voltage line), and a driving voltage line PL. In an embodiment, at least one of the above-described lines, for example, the driving voltage line PL may be shared by neighboring pixels PX.

The plurality of thin film transistors T1 to T7 may include a driving thin film transistor T1, a switching thin film transistor T2, a compensation thin film transistor T3, a first initialization thin film transistor T4, an operation control thin film transistor T5, a light emission control thin film transistor T6, and a second initialization thin film transistor T7.

The light-emitting element LD may include a first electrode (for example, an anode electrode or a pixel electrode) and a second electrode (for example, a cathode electrode or a common electrode). The first electrode of the light-emitting element LD is connected to the driving thin film transistor T1 via the light emission control thin film transistor T6 to receive a driving current $I_{LD}$, and the second electrode of the light-emitting element LD may receive a low power supply voltage ELVSS. The light-emitting element LD may generate light having a luminance corresponding to the driving current $I_{LD}$.

Some of the plurality of thin film transistors T1 to T7 may be provided as an n-channel MOSFET (NMOS), and the rest may be provided as a p-channel MOSFET (PMOS). For example, among the plurality of thin film transistors T1 to T7, the compensation thin film transistor T3 and the first initialization thin film transistor T4 may be provided as NMOS (n-channel MOSFETs), and the rest may be provided as PMOS (p-channel MOSFETs).

In another embodiment, among the plurality of thin film transistors T1 to T7, the compensation thin film transistor T3, the first initialization thin film transistor T4, and second initialization thin film transistor T7 may be provided as an NMOS, and the rest may be provided as a PMOS. Alternatively, only one of the plurality of thin film transistors T1 to T7 may be provided as an NMOS and the rest may be provided as a PMOS. Alternatively, all the plurality of thin film transistors T1 to T7 may be provided as an NMOS or a PMOS.

Signal lines may include a first scan line SL1 that transfers a first scan signal Sn, a second scan line SL2 that transfers a second scan signal Sn', a third scan line SL3 that transfers a third scan signal S1 to the first initialization thin film transistor T4, a light emission control line EL that transfers a light emission control signal En to the operation control thin film transistor T5 and the light emission control thin film transistor T6, a next scan line SLn that transfers a next scan signal Sn+1 to the second initialization thin film transistor T7, and a data line DL that crosses the first scan line SL1 and transfers a data signal Dm. The first scan signal Sn may be a current scan signal, and the next scan signal Sn+1 may be a next scan signal of the first scan signal Sn.

The driving voltage line PL may transfer the driving voltage ELVDD to the driving thin film transistor T1, and the first initialization voltage line VL1 may transfer an initialization voltage Vint for initializing the driving thin film transistor T1 and the pixel electrode.

A driving gate electrode of the driving thin film transistor T1 may be connected to the storage capacitor Cst, a drive source region of the driving thin film transistor T1 may be connected to the driving voltage line PL via the operation control thin film transistor T5, and a drive drain region of the driving thin film transistor T1 may be electrically connected to the first electrode of the light-emitting element LD via the light emission control thin film transistor T6. The driving thin film transistor T1 may receive a data signal Dm in response to the switching operation of the switching thin film transistor T2 and supply a driving current $I_{LD}$ to the light-emitting element LD.

A switching gate electrode of the switching thin film transistor T2 may be connected to the first scan line SL1 that transmits the first scan signal Sn, a switching source region of the switching thin film transistor T2 may be connected to the data line DL, and a switching drain region of the switching thin film transistor T2 may be connected to the driving voltage line PL via the operation control thin film transistor T5 while being connected to the drive source region of the driving thin film transistor T1. The switching thin film transistor T2 may be turned on in response to the first scan signal Sn received through the first scan line SL1 to perform a switching operation of transferring the data signal Dm transmitted to the data line DL to the drive source region of the driving thin film transistor T1.

A compensation gate electrode of the compensation thin film transistor T3 is connected to the second scan line SL2. A compensation drain region of the compensation thin film transistor T3 may be connected to the pixel electrode of the light-emitting element LD via the light emission control thin film transistor T6 while being connected to the drive drain region of driving thin film transistor T1. A compensation source region of the compensation thin film transistor T3 may be connected to the first electrode CE1 of the storage capacitor Cst and the driving gate electrode of the driving thin film transistor T1. In addition, the compensation source region may be connected to a first initialization drain region of the first initialization thin film transistor T4.

The compensation thin film transistor T3 may be turned on in response to the second scan signal Sn' received through the second scan line SL2 and electrically connect the driving gate electrode of the driving thin film transistor T1 and the drive drain region to make the driving thin film transistor T1 diode-connected.

The first initialization gate electrode of the first initialization thin film transistor T4 may be connected to the third scan line SL3. A first initialization source region of the first initialization thin film transistor T4 may be connected to a second initialization source region of the second initialization thin film transistor T7 and the first initialization voltage line VL1. A first initialization drain region of the first initialization thin film transistor T4 may be connected to a first electrode CE1 of the storage capacitor Cst, the compensation source region of the compensation thin film transistor T3, and the driving gate electrode of the driving thin film transistor T1. The initialization thin film transistor T4 may be turned on in response to the third scan signal Si received through the third scan line SL3 and transmit the initialization voltage Vint to the driving gate electrode of the driving thin film transistor T1, thereby performing an initialization operation for initializing the voltage of the driving gate electrode of the driving thin film transistor T1.

An operation control gate electrode of the operation control thin film transistor T5 may be connected to the light emission control line EL, an operation control source region of the operation control thin film transistor T5 may be connected to the driving voltage line PL, and an operation control drain region of the operation control thin film transistor T5 may be connected to the drive source region of the driving thin film transistor T1 and the switching drain region of the switching thin film transistor T2.

A light emission control gate electrode of the light emission control thin film transistor T6 may be connected to the light emission control line EL, a light emission control source region of the light emission control thin film transistor T6 may be connected to the drive drain region of driving thin film transistor T1 and the compensation drain region of the compensation thin film transistor T3, and the light emission control drain region of the light emission control thin film transistor T6 may be electrically connected to a second initialization drain region of the second initialization thin film transistor T7 and the pixel electrode of the light-emitting element LD.

The operation control thin film transistor T5 and the light emission control thin film transistor T6 are simultaneously turned on in response to the light emission control signal En received through the light emission control line EL, so that the driving voltage ELVDD is transferred to the light-emitting element LD and the driving current $I_{LD}$ flows through the light-emitting element LD.

The second initialization gate electrode of the second initialization thin film transistor T7 may be connected to the next scan line SLn, the second initialization drain region of the second initialization thin film transistor T7 may be connected to the light emission control drain region of the light emission control thin film transistor T6 and the pixel electrode of light-emitting element LD, and the second initialization source region of the second initialization thin film transistor T7 may be connected to the second initialization voltage line VL2 to receive an anode initialization voltage Aint. The second initialization thin film transistor T7 is turned on in response to the next scan signal Sn+1 received through the next scan line SLn to initialize the pixel electrode of the light-emitting element LD.

In another embodiment, the second initialization thin film transistor T7 may be connected to the light emission control line EL and driven in response to the light emission control signal En. The positions of the source regions and the drain regions may be changed depending on the type (p-type or n-type) of the transistor.

The storage capacitor Cst may include the first electrode CE1 and a second electrode CE2. The first electrode CE1 of the storage capacitor Cst is connected to the driving gate electrode of the driving thin film transistor T1, and the second electrode CE2 of the storage capacitor Cst is connected to the driving voltage line PL. A charge corresponding to a difference between the driving gate electrode voltage of the driving thin film transistor T1 and the driving voltage ELVDD may be stored in the storage capacitor Cst.

A boosting capacitor Cbs may include a first electrode CE1' and a second electrode CE2'. The first electrode CE1' of the boosting capacitor Cbs may be connected to the first electrode CE1 of the storage capacitor Cst, and the second electrode CE2' of the boosting capacitor Cbs may receive the first scan signal Sn. The boosting capacitor Cbs may compensate for the voltage drop of the gate terminal by increasing the voltage at the gate terminal of the driving thin film transistor T1 at a point in time when the supply of the first scan signal Sn is stopped.

A detailed operation of each pixel PX according to an embodiment is as follows.

During the initialization period, when the third scan signal Si is supplied through the third scan line SL3, the first initialization thin film transistor T4 is turned on in response to the third scan signal Si, and the driving thin film transistor T1 is initialized by the initialization voltage Vint supplied from the first initialization voltage line VL1.

During a data programming period, when the first scan signal Sn and the second scan signal Sn' are supplied through the first scan line SL1 and the second scan line SL2, the switching thin film transistor T2 and the compensation thin film transistor T3 are turned on in response to the first scan signal Sn and the second scan signal Sn'. At this time, the driving thin film transistor T1 is diode-connected by the turned-on compensation thin film transistor T3 and forward biased.

Then, a compensation voltage (Dm+Vth, Vth is a negative (−) value), which becomes lower than the data signal Dm supplied from the data line DL by a threshold voltage (Vth) of the driving thin film transistor T1, is applied to the driving gate electrode of the driving thin film transistor T1.

The driving voltage ELVDD and the compensation voltage Dm+Vth are applied to both ends of the storage capacitor Cst, and a charge corresponding to the voltage difference between both the ends is stored in the storage capacitor Cst.

During a light emission period, the operation control thin film transistor T5 and the light emission control thin film transistor T6 are turned on in response to the light emission control signal En supplied from the light emission control line EL. The driving current $I_{LD}$ is generated according to a voltage difference between the voltage of the driving gate electrode of the driving thin film transistor T1 and the driving voltage ELVDD, and the driving current $I_{LD}$ is supplied to the light-emitting element LD through the light emission control thin film transistor T6.

In this embodiment, at least one of the pluralities of thin film transistors T1 to T7 includes a semiconductor layer containing an oxide, and the rest includes a semiconductor layer containing silicon.

Specifically, the driving thin film transistor T1 that directly affects the brightness of the display device is configured to include a semiconductor layer made of polycrystalline silicon having high reliability, thereby achieving a high-resolution display device.

Since an oxide semiconductor has high carrier mobility and low leakage current, the voltage drop is not large even if the driving time is long. That is, the color change of the image caused by the voltage drop is not large even during low-frequency driving, so that the low-frequency driving is possible.

As such, since the oxide semiconductor has the advantage of low leakage current, it is possible to prevent a leakage current flowing to the driving gate electrode and reduce a power consumption by employing, as the oxide semiconductor, at least one of the compensation thin film transistor T3 connected to the driving gate electrode of driving thin film transistor T1, the first initialization thin film transistor T4, or the second initialization thin film transistor T7.

Figure 7A:
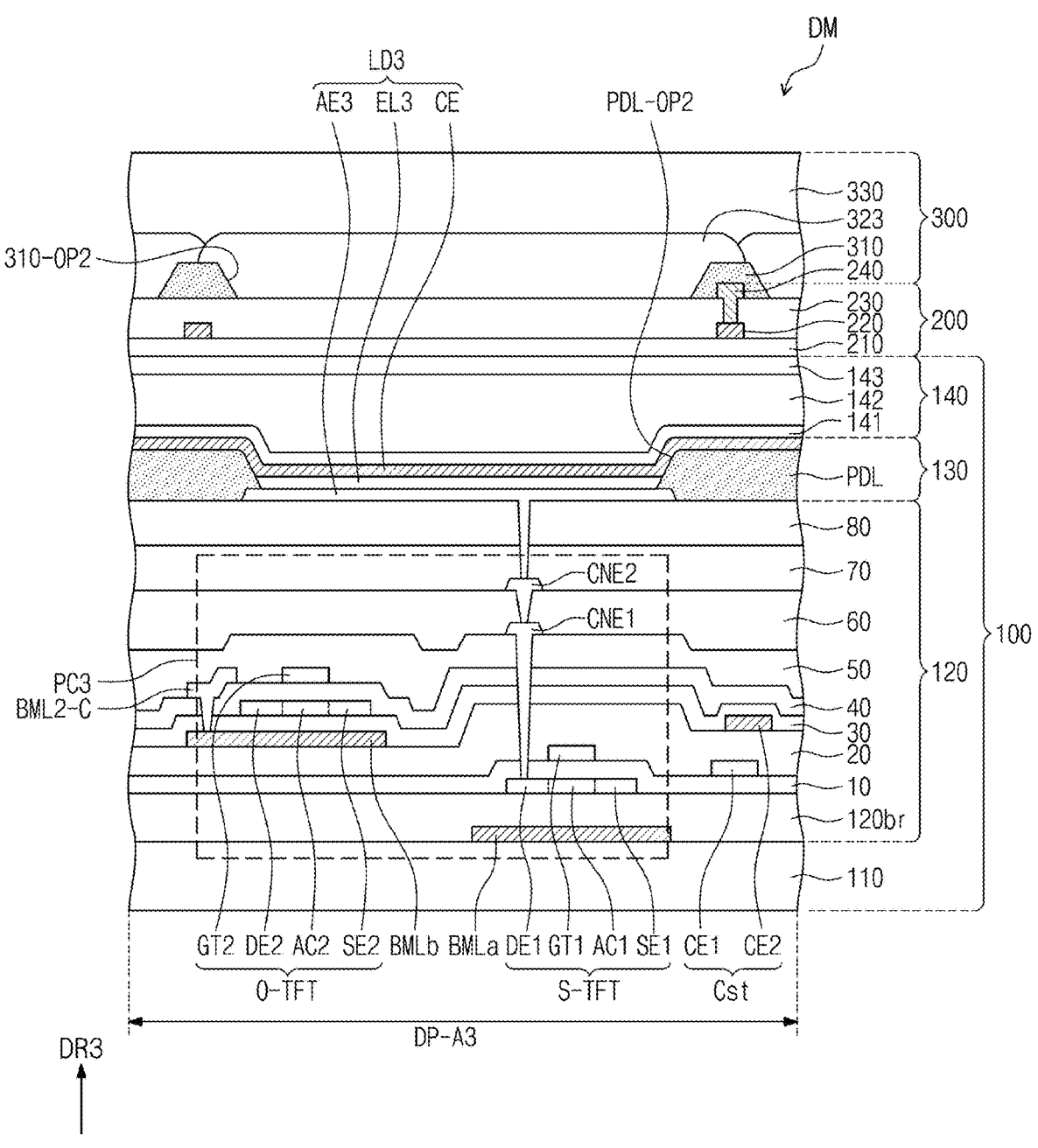
FIG. 7A is a cross-sectional view of a display module according to an embodiment.
Figure 7B:
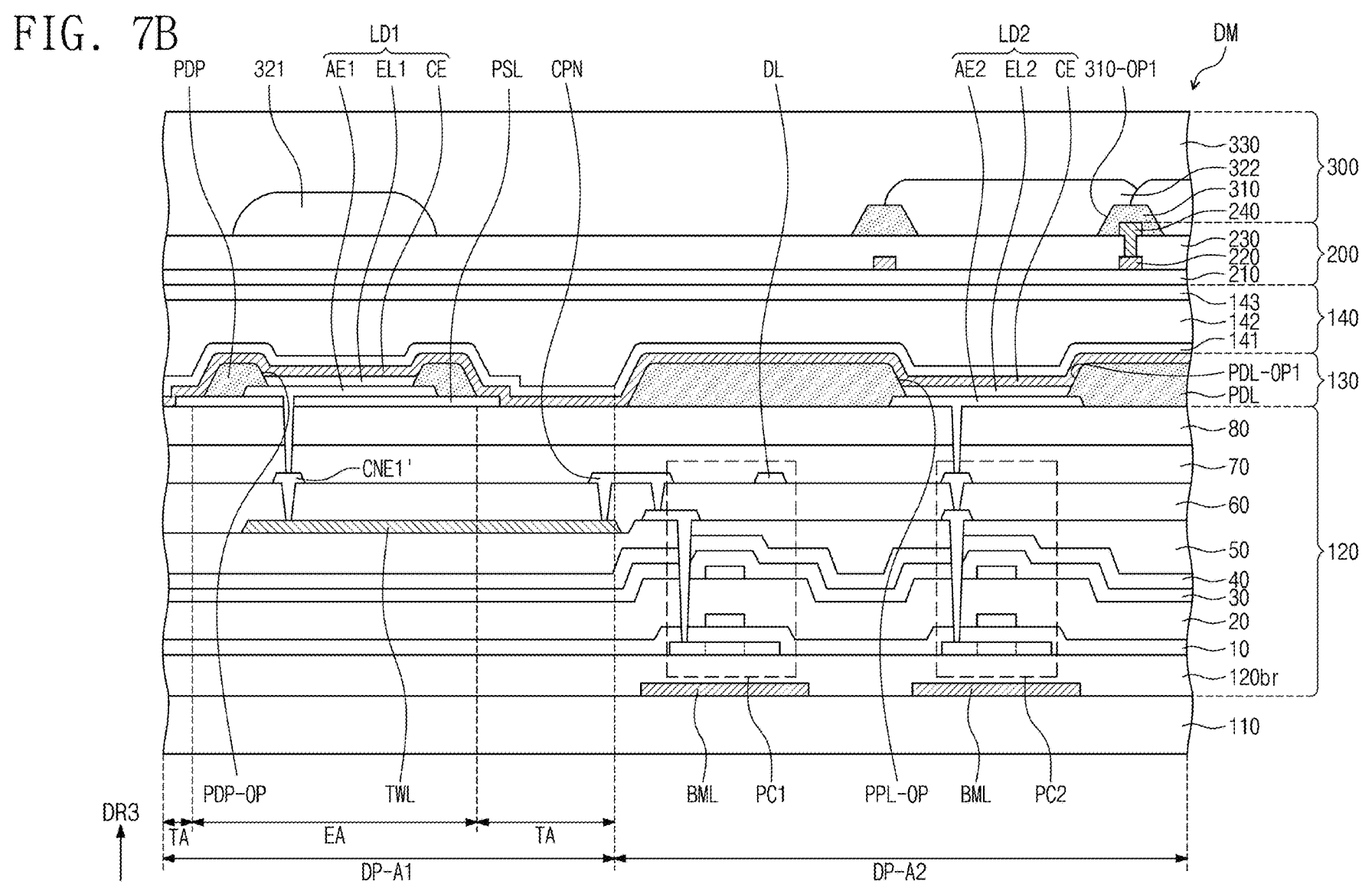

FIG. 7A is a cross-sectional view of a display module according to an embodiment. FIG. 7B is a cross-sectional view of a display module according to an embodiment. FIG. 7A is a cross-sectional view of a portion including a third region DP-A3, and FIG. 7B is a cross-sectional view of a portion including a first region DP-A1 and a second region DP-A2.

Referring to FIGS. 7A and 7B, the display panel 100 may include a plurality of insulating layers, a semiconductor pattern, a conductive pattern, and a signal line, etc. An insulating layer, a semiconductor layer, and a conductive layer are formed by coating, vapor deposition, or the like. Thereafter, the insulating layer, the semiconductor layer, and the conductive layer may be selectively patterned through a photolithographic method. In this way, a semiconductor pattern, a conductive pattern, a signal line, etc., included in the circuit layer 120 and the light-emitting element layer 130 are formed. Thereafter, the encapsulation layer 140 that covers the light-emitting element layer 130 may be formed.

FIG. 7A illustrates a silicon thin film transistor S-TFT and an oxide thin film transistor O-TFT in the third light-emitting element LD3 and the third pixel circuit PC3 (see FIG. 5). FIG. 7B illustrates the first light-emitting element LD1 and the first pixel circuit PC1, and illustrates the second light-emitting element LD2 and the second pixel circuit PC2.

A buffer layer 120*br* may be disposed on the base layer 110. The buffer layer 120*br* may prevent the phenomenon that metal atoms or impurities diffuse from the base layer 110 into a first semiconductor pattern. In addition, the buffer layer 120*br* may allow the first semiconductor pattern to be uniformly formed by adjusting the heat supply rate during the crystallization process for pattering the first semiconductor pattern.

A first back metal layer BMLa may be disposed under a silicon thin film transistor S-TFT, and a second back metal layer BMLb may be disposed under an oxide thin film transistor O-TFT. The first and second back metal layers BMLa and BMLb may be disposed to overlap first to third pixel circuits PC1, PC2, and PC3 to protect the first to third pixel circuits PC1, PC2, and PC3. The first and second back metal layers BMLa and BMLb may block an electric potential caused by phenomenon of the polarization of the base layer 110 from affecting the first to third pixel circuits PC1, PC2, and PC3.

The first back metal layer BMLa may be disposed corresponding to at least a partial region of the pixel circuit PC (see FIG. 6). In an embodiment, the first back metal layer BMLa may be disposed to overlap the driving thin film transistor T1 (see FIG. 6) including the silicon thin film transistor S-TFT.

The first back metal layer BMLa may be disposed between the base layer 110 and the buffer layer 120*br*. In an embodiment of the inventive step, the first back metal layer BMLa may be disposed on the base layer 110 in which an organic layer and an inorganic layer are alternately stacked, and an inorganic barrier layer may further be disposed between the first back metal layer BMLa and the buffer layer 120*br*. The first back metal layer BMLa may be connected to an electrode or a line, and receive a constant voltage or a signal therefrom. In another embodiment, the first back metal layer BMLa may be provided in isolated form from another electrode or line.

The second back metal layer BMLb may be disposed under and corresponding to the oxide thin film transistor O-TFT. The second back metal layer BMLb may be disposed between the second insulating layer 20 and the third insulating layer 30. The second back metal layer BMLb and the second electrode CE2 of the storage capacitor Cst may be disposed on the same layer. The second back metal layer BML2 may be connected to the contact electrode BML2-C, and receive a constant voltage or a signal. The contact electrode BML2-C and the second gate electrode GT2 of the oxide thin film transistor O-TFT may be disposed on the same layer.

Each of the first back metal layer BMLa and the second back metal layer BMLb may include a reflective metal. For example, each of the first back metal layer BMLa and the second back metal layer BML2*b* may include silver (Ag), a silver-containing alloy, molybdenum (Mo), a molybdenum-containing alloy, aluminum (A1), an aluminum-containing alloy, aluminum nitride (AlN), tungsten (W), tungsten nitride (WN), copper (Cu), titanium (Ti), p+ doped amorphous silicon, and the like. The first back metal layer BMLa and the second back metal layer BMLb may include the same material or different materials.

The first semiconductor pattern may be disposed on the buffer layer 120*br*. The first semiconductor pattern may include a silicon semiconductor. For example, the silicon semiconductor may include amorphous silicon, polycrystalline silicon, and the like. For example, the first semiconductor pattern may include low-temperature polysilicon.

FIG. 7A illustrates only a portion of the first semiconductor pattern disposed on the buffer layer 120*br*. Alternatively, the first semiconductor pattern may be further disposed in another region. The first semiconductor pattern may be arranged over the pixels according to a specific rule. The first semiconductor pattern may have different electrical properties depending on whether the semiconductor is doped or not. The first semiconductor pattern may include a first region having high conductivity and a second region having low conductivity. The first region may be doped with an N-type dopant or a P-type dopant. A P-type transistor may include a doped region doped with a P-type dopant, and an N-type transistor may include a doped region doped with an N-type dopant. The second region may be an undoped region, or a region doped with a concentration lower than that of the first region.

The conductivity of the first region is greater than that of the second region, and the first region may substantially serve as an electrode or a signal line. The second region may substantially correspond to an active region (or channel) of the transistor. In other words, a portion of the semiconductor pattern may be an active region of a transistor, another portion may be a source region or drain region of the transistor, and another portion may be a connection electrode or a connection signal line.

A source region SE1, an active region AC1, and a drain region DE1 of the silicon thin film transistor S-TFT may be formed from the first semiconductor pattern. The source region SE1 and the drain region DE1 may extend in opposite directions from the active region AC1 on a cross-section.

The first insulating layer 10 may be disposed on the buffer layer 120br. The first insulating layer 10 may overlap the plurality of pixels in common and cover the first semiconductor pattern. The first insulating layer 10 may be an inorganic layer and/or an organic layer, and may have a single-layer or multi-layer structure. The first insulating layer 10 may include at least one of aluminum oxide, titanium oxide, silicon oxide, silicon nitride, silicon oxynitride, zirconium oxide, or hafnium oxide. In this embodiment, the first insulating layer 10 may be a single-layer silicon oxide layer. Not only the first insulating layer 10 but also an insulating layer of the circuit layer 120 to be described later may be an inorganic layer and/or an organic layer, and may have a single-layer or multi-layer structure. The inorganic layer may include at least one of the above-described materials, but is not limited thereto.

A first gate electrode GT1 of the silicon thin film transistor S-TFT is disposed on the first insulating layer 10. The first gate electrode GT1 may be a portion of a metal pattern. The first gate electrode GT1 overlaps the active region AC1. In a process of doping the first semiconductor pattern, the first gate electrode GT1 may function as a mask. The first gate electrode GT1 may include titanium (Ti), silver (Ag), a silver-containing alloy, molybdenum (Mo), a molybdenum-containing alloy, aluminum (Al), an aluminum-containing alloy, aluminum nitride (AlN), tungsten (W), tungsten nitride (WN), copper (Cu), indium tin oxide (ITO), indium zinc oxide (IZO), etc., but is not limited thereto.

A second insulating layer 20 may be disposed on the first insulating layer 10 and cover the first gate electrode GT1. The second insulating layer 20 may be an inorganic layer and/or an organic layer, and may have a single-layer or multi-layer structure. The second insulating layer 20 may include at least one of silicon oxide, silicon nitride, or silicon oxynitride. In this embodiment, the second insulating layer 20 may have a multi-layer structure including a silicon oxide layer and a silicon nitride layer.

A third insulating layer 30 may be disposed on the second insulating layer 20. The third insulating layer 30 may have a single-layer or multi-layer structure. For example, the third insulating layer 30 may have a multi-layer structure including a silicon oxide layer and a silicon nitride layer. The second electrode CE2 of the storage capacitor Cst may be disposed between the second insulating layer 20 and the third insulating layer 30. In addition, the first electrode CE1 of the storage capacitor Cst may be disposed between the first insulating layer 10 and the second insulating layer 20.

A second semiconductor pattern may be disposed on the third insulating layer 30. The second semiconductor pattern may include an oxide semiconductor. The oxide semiconductor may include a plurality of regions divided according to whether the metal oxide is reduced or not. A region in which the metal oxide is reduced (hereinafter, a reduced region) has greater conductivity than a region in which the metal oxide does not reduced (hereinafter, a non-reduced region). The reduced region substantially serves as a source/drain or a signal line of the transistor. The non-reduced region substantially corresponds to an active region (or a semiconductor region, a channel) of the transistor. In other words, a portion of the second semiconductor pattern may be an active region of the transistor, another portion may be a source/drain region of the transistor, and another portion may be a signal transmission region.

A source region SE2, an active region AC2, and a drain region DE2 of the oxide thin film transistor O-TFT may be formed from the second semiconductor pattern. The source region SE2 and the drain region DE2 may extend in opposite directions from the active region AC2 on a cross-section.

A fourth insulating layer 40 may be disposed on the third insulating layer 30. The fourth insulating layer 40 may overlap the plurality of pixels in common and cover the second semiconductor pattern. The fourth insulating layer 40 may include at least one of aluminum oxide, titanium oxide, silicon oxide, silicon nitride, silicon oxynitride, zirconium oxide, or hafnium oxide A second gate electrode GT2 of the oxide thin film transistor O-TFT is disposed on the fourth insulating layer 40. The second gate electrode GT2 may be a portion of a metal pattern. The second gate electrode GT2 overlaps the active region AC2. In a process of doping the second semiconductor pattern, the second gate electrode GT2 may function as a mask.

A fifth insulating layer 50 may be disposed on the fourth insulating layer 40 and cover the second gate electrode GT2. The fifth insulating layer 50 may be an inorganic layer and/or an organic layer, and may have a single-layer or multi-layer structure.

A first connection electrode CNE1 may be disposed on the fifth insulating layer 50. The first connection electrode CNE1 may be connected to the drain region DE1 of the silicon thin film transistor S-TFT through a contact hole passing through the first to fifth insulating layers 10, 20, 30, 40, and 50.

A sixth insulating layer 60 may be disposed on the fifth insulating layer 50. A second connection electrode CNE2 may be disposed on the sixth insulating layer 60. The second connection electrode CNE2 may be connected to the first connection electrode CNE1 through a contact hole passing through the sixth insulating layer 60. A seventh insulating layer 70 may be disposed on the sixth insulating layer 60 and cover the second connection electrode CNE2. An eighth insulating layer 80 may be disposed on the seventh insulating layer 70.

Each of the sixth insulating layer 60, the seventh insulating layer 70, and the eighth insulating layer 80 may be an organic layer. For example, each of the sixth insulating layer 60, the seventh insulating layer 70, and the eighth insulating layer 80 may include benzocyclobutene (BCB), polyimide, hexamethyldisiloxane (HMDSO), general general-purpose polymers such as polymethylmethacrylate (PMMA) or polystyrene (PS), a polymer derivative having a phenolic group, an acrylic polymer, an imide-based polymer, an aryl ether-based polymer, an amide-based polymer, a fluorine-based polymer, p-xylene-based polymer, vinyl alcohol-based polymer, a blend thereof, etc.

The light-emitting element layer 130 including first to third light-emitting elements LD1, LD2, and LD3 may be disposed on the circuit layer 120. The first light-emitting element LD1 may include a first pixel electrode AE1, a first light-emitting layer EL1, and a common electrode CE, the second light-emitting element LD2 may include a second pixel electrode AE2, a second light-emitting layer EL2, and a common electrode CE2, and the third light-emitting element LD3 may include a third pixel electrode AE3, a third light-emitting layer EL3, and a common electrode CE3. The common electrode CE may be provided in common by being connected to the pixels PX (see FIG. 4).

The first pixel electrode AE1, the second pixel electrode AE2, and the third pixel electrode AE3 may be disposed on the eighth insulating layer 80. Each of the first pixel electrode AE1, the second pixel electrode AE2, and the third pixel electrode AE3 may be a (semi-) transflective electrode or a reflective electrode. In an embodiment, each of the first pixel electrode AE1, the second pixel electrode AE2, and the third pixel electrode AE3 may include a reflective layer formed of Ag, Mg, Al, Pt, Pd, Au, Ni, Nd, Ir, Cr, or a compound thereof, and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnO) or indium oxide ($In_2O_3$), and aluminum doped zinc oxide (AZO). For example, each of the first pixel electrode AE1, the second pixel electrode AE2, and the third pixel electrode AE3 may be provided with ITO/Ag/ITO.

The pixel defining layer PDL and the pixel defining pattern PDP may be disposed on the eighth insulating layer 80. The pixel defining layer PDL and the pixel defining pattern PDP may include the same material and may be formed through the same process. Each of the pixel defining layer PDL and the pixel defining pattern PDP may have light absorbing properties. For example, each of the pixel defining layer PDL and the pixel defining pattern PDP may have a black color. Each of the pixel defining layer PDL and the pixel defining pattern PDP may include a black coloring agent. The black coloring agent may include a black dye or black pigment. The black coloring agent may include a carbon black, a metal such as chromium, or an oxide thereof.

The pixel defining pattern PDP may be disposed in the first region DP-A1. The pixel defining pattern PDP may cover a portion of the first pixel electrode AE1. For example, the pixel defining pattern PDP may cover an edge of the first pixel electrode AE1. The pixel defining pattern PDP may have a ring shape when viewed in the thickness direction of the display panel 100, for example, when viewed from the third direction DR3.

The pixel defining layer PDL may be disposed in the second region DP-A2 and the third region DP-A3. The pixel defining layer PDL may cover a portion of each of the second pixel electrode AE2 and the third pixel electrode AE3. For example, a first opening PDL-OP1, which exposes a portion of the second pixel electrode AE2, and a second opening PDL-OP2, which exposes a portion of the third pixel electrode AE3, may be defined in the pixel defining layer PDL.

The pixel defining pattern PDP may increase the distance between the edge of the first pixel electrode AE1 and the common electrode CE, and the pixel defining layer PDL may increase distances between an edge of each of the second and third pixel electrodes AE2 and AE3 and the common electrode CE. Accordingly, the pixel defining pattern PDP and the pixel-defining layer PDL may serve to prevent an arc from occurring at the edges of each of the first, second, and third pixel electrodes AE1, AE2, and AE3.

In the first region DP-A1, a region, overlapping a portion where the first pixel electrode AE1 and the pixel defining pattern PDP are disposed, is defined as an element region EA and the remaining region may be defined as a transmission region TA.

The first pixel electrode AE1 may be electrically connected to the first pixel circuit PC1 disposed in the second region DP-A2. For example, the first pixel electrode AE1 may be electrically connected to the first pixel circuit PC1 through a connection line TWL and a connection bridge CPN. In this case, the connection line TWL may overlap the transmission region TA. Accordingly, the connection line TWL may include a light transmission material.

The connection line TWL may be disposed between the fifth insulating layer 50 and the sixth insulating layer 60, but is not particularly limited thereto. The connection bridge CPN may be disposed between the sixth insulating layer 60 and the seventh insulating layer 70. The connection bridge CPN may be connected to the connection line TWL and the first pixel circuit PC1. The connection line TWL may be provided in plurality, a portion thereof may be disposed between the fifth insulating layer 50 and the sixth insulating layer 60, and another portion thereof may be disposed between the sixth insulating layer 60 and the seventh insulating layer 70.

The first light-emitting layer EL1 may be disposed on the first pixel electrode AE1, the second light-emitting layer EL2 may be disposed on the second pixel electrode AE2, and the third light-emitting layer EL3 may be disposed on the third pixel electrode AE3. In this embodiment, each of the first to third light-emitting layers EL1, EL2, and EL3 may emit light of at least one color of blue, red, or green.

The common electrode CE may be disposed on the first to third light-emitting layers EL1, EL2, and EL3. The common electrode CE may have an integral shape, and be commonly disposed in the plurality of pixels PX (see FIG. 4).

A hole control layer may be disposed between the first to third pixel electrodes AE1, AE2, and AE3 and the first to third light-emitting layers EL1, EL2, and EL3. The hole control layer may include a hole transport layer and may further include a hole injection layer. An electron control layer may be disposed between the first to third light-emitting layers EL1, EL2, and EL3 and the common electrode CE. The electron control layer may include an electron transport layer and may further include an electron injection layer. The hole control layer and the electron control layer may be formed in common in the plurality of pixels PX (see FIG. 4) using an open mask.

Light passing through the display module DM may be diffracted. Light diffraction may be affected by the shape of the first pixel electrode AE1, the size of the first pixel electrode AE1, the arrangement interval of the first pixel electrode AE1, the size of the transmission region TA, etc. According to an embodiment, a pattern PSL may be provided to eliminate or reduce patterns caused by light diffraction.

The pattern PSL may be disposed between the circuit layer 120 and the light-emitting element layer 130. At least a portion of the pattern PSL may overlap the transmission region TA. Another portion of the transmission region TA may not overlap the pattern PSL. Thus, a portion of light passing through the transmission region TA may pass through the pattern PSL, and another portion of light may not pass through the pattern PSL. The phase of light passing through the pattern PSL may differ from the phase of light that does not pass through the pattern PSL. The pattern PSL may be referred to as a phase shift pattern.

According to an embodiment of the inventive concepts, the difference between the phase of the first light passing through the pattern PSL and the phase of the second light that does not pass through the pattern PSL may be closer to $(2n-1)\pi$ radians. Thus, the first light and the second light may partially offset each other, and accordingly, diffraction patterns may be eliminated or reduced.

The encapsulation layer 140 may be disposed on the light-emitting element layer 130. The encapsulation layer 140 may include an inorganic layer 141, an organic layer 142, and an inorganic layer 143 that are sequentially stacked, but the layers that constitute the encapsulation layer 140 are not limited thereto.

The inorganic layers 141 and 143 may protect the light-emitting element layer 130 from moisture and oxygen, and the organic layer 142 may protect the light-emitting element layer 130 from foreign substances such as dust particles. The inorganic layers 141 and 143 may include a silicon nitride layer, a silicon oxynitride layer, a silicon oxide layer, a titanium oxide layer, or an aluminum oxide layer, etc. The organic layer 142 may include an acrylic organic layer, but is not limited thereto.

The refractive index of the pattern PSL may be different from the refractive index of the organic layer 142 of the encapsulation layer 140, or the refractive index of the pattern PSL may be different from the refractive index of the eighth insulating layer 80 of the circuit layer 120 in contact with the pattern PSL. The eighth insulating layer 80 may be referred to as an upper insulating layer. For example, the refractive index of the organic layer 142 may be about 1.5293, and the refractive index of the eighth insulating layer 80 may be about 1.6542. The refractive index of the pattern PSL may be greater than or less than the refractive index of the organic layer 142. For example, the pattern PSL may include an indium tin oxide having a refractive index of about 2.08 or a silicon nitride having a refractive index of about 1.4, but is not particularly limited thereto.

A material constituting the pattern PSL may be variously employed as long as the material has a refractive index different from the refractive index of the organic layer 142. For example, the pattern PSL may include a transparent conductive oxide or an inorganic material. The transparent conductive oxide may include indium zinc oxide (IZO), indium gallium zinc oxide (IGZO), zinc oxide (ZnO), or indium oxide ($In_2O_3$). The inorganic material may include aluminum oxide, titanium oxide, silicon oxide, silicon nitride, silicon oxynitride, zirconium oxide, or hafnium oxide. The pattern PSL may include an organic material as long as the material has a refractive index different from that of the organic layer 142. The thickness of the pattern PSL may be adjusted according to the refractive index of a material constituting the pattern PSL. For example, the thickness of the pattern PSL may be set such that the phase difference between the light passing through the pattern PSL and the light that does not pass through the pattern PSL within a specific wavelength band is close to about 180 degrees.

The sensor layer 200 may be disposed on the display panel 100. The sensor layer 200 may be referred to as a sensor, an input sensing layer, or an input sensing panel. The sensor layer 200 may include a base layer 210, a first conductive layer 220, a sensing insulating layer 230, and a second conductive layer 240.

The base layer 210 may be directly disposed on the display panel 100. The base layer 210 may be an inorganic layer including at least one of silicon nitride, silicon oxynitride, or silicon oxide. Alternatively, the base layer 210 may be an organic layer including an epoxy resin, an acrylic resin, or an imide-based resin. The base layer 210 may have a single-layer structure or a multi-layer structure stacked along the third direction DR3.

Each of the first conductive layer 220 and the second conductive layer 240 may have a single-layer structure or a multi-layer structure stacked along the third direction DR3.

The single-layered conductive layer may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), or indium zinc tin oxide (IZTO). In addition, the transparent conductive layer may include a conductive polymer such as PEDOT, metal nanowires, graphene, or the like.

The multi-layered conductive layer may include metal layers. The metal layers may have, for example, a three-layer structure of titanium/aluminum/titanium. The multi-layered conductive layer may include at least one metal layer and at least one transparent conductive layer.

The sensing insulating layer 230 may be disposed between the first conductive layer 220 and the second conductive layer 240. The sensing insulating layer 230 may include an inorganic layer. The inorganic layer may include at least one of aluminum oxide, titanium oxide, silicon oxide, silicon nitride, silicon oxynitride, zirconium oxide, or hafnium oxide.

Alternatively, the sensing insulating layer 230 may include an organic film. The organic film may include at least one of an acrylic resin, a methacrylic resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

The anti-reflection layer 300 may be disposed on the sensor layer 200. The anti-reflection layer 300 may include a partition layer 310, a first color filter 321, a second color filter 322, a third color filter 323, and a planarization layer 330.

The material constituting the partition layer 310 is not particularly limited as long as the material absorbs light. The partition layer 310 is a layer having a black color. In an embodiment, the partition layer 310 may include a black coloring agent. The black coloring agent may include a black dye or black pigment. The black coloring agent may include a carbon black, a metal such as chromium, or an oxide thereof.

The partition layer 310 may cover the second conductive layer 240 of the sensor layer 200. The partition layer 310 may prevent reflection of external light by the second conductive layer 240. The partition layer 310 may overlap the second region DP-A2 and the third region DP-A3 and may not overlap the first region DP-A1. That is, a portion of the partition layer 310 that overlaps the first region DP-A1 may be removed. Accordingly, the light transmittance of the first region DP-A1 may be further improved.

A plurality of openings 310-OP1 and 310-OP2 may be defined in the partition layer 310. The first opening 310-OP1 may overlap the second pixel electrode AE2, and the second opening 310-OP2 may overlap the third pixel electrode AE3.

The first color filter 321 may be disposed to overlap the first region DP-A1, the second color filter 322 may be disposed to overlap the second first region DP-A2, and the third color filter 323 may be disposed to overlap the third region DP-A3. The first color filter 321 may be disposed to overlap the first pixel electrode AE1, the second color filter 322 may be disposed to overlap the second pixel electrode AE2, and the third color filter 323 may be disposed to overlap the third pixel electrode AE3.

Since the partition layer 310 does not overlap the first region DP-A1, the first color filter 321 may be spaced apart from the partition layer 310. That is, the first color filter 321 may not contact the partition layer 310. The second color filter 322 may cover the first opening 310-OP1, and the third color filter 323 may cover the second opening 310-OP2. Each of the second color filter 322 and the third color filter 323 may contact the partition layer 310. The opening areas of the first and second openings 310-OP1 and 310-OP2 of the partition layer 310 may be larger than the opening areas of the first and second openings PDL-OP1 and PDL-OP2 of the pixel defining layer PDL.

The planarization layer 330 may cover the partition layer 310, the first color filter 321, the second color filter 322, and the third color filter 323. The planarization layer 330 may include an organic material, and may provide a flat surface on the upper surface of the planarization layer 330. The planarization layer 330 may be omitted in some implementations.

Figure 8:
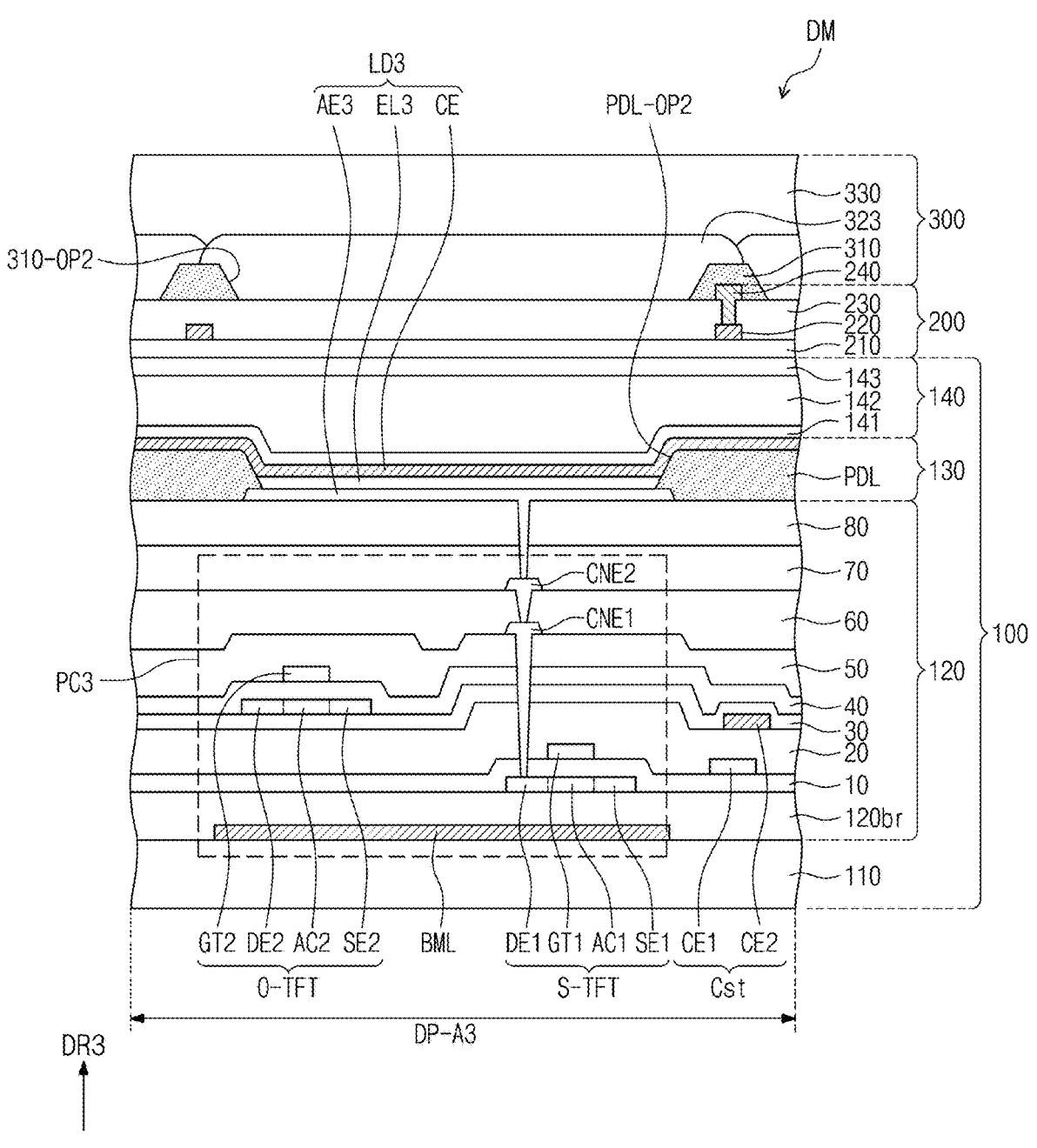
FIG. 8 is a cross-sectional view of a display module according to an embodiment.

FIG. 8 is a cross-sectional view of a display module according to an embodiment. The description of FIG. 8 will be focused on differences compared to FIG. 7A.

Referring to FIG. 8, a back metal layer BML may be disposed between the base layer 110 and the buffer layer 120*br*. The back metal layer BML may be disposed to overlap the first to third pixel circuits PC1, PC2, and PC3 to protect the first to third pixel circuits PC1, PC2, and PC3. The back metal layer BML may block an electric potential caused by the polarization of the base layer 110 from affecting the first to third pixel circuits PC1, PC2, and PC3.

The back metal layer BML may be formed to correspond to the entirety of the display region DP-A (see FIG. 4) and may include a corresponding hole in a region corresponding to the first region DP-A1. That is, the back metal layer BML may not overlap the first region DP-A1. The back metal layer BML may be omitted in some implementations.

Figure 9:
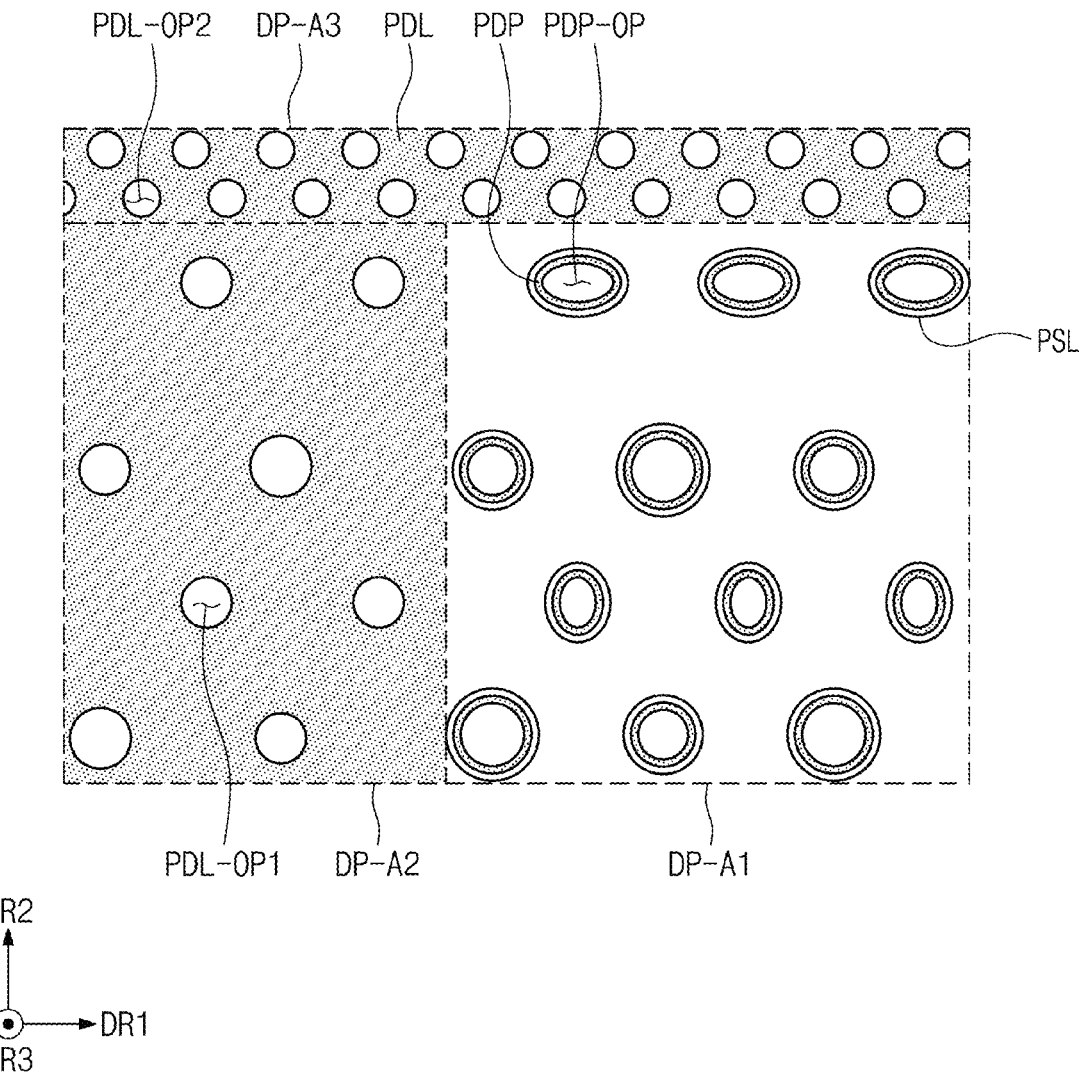
FIG. 9 is a plane view illustrating a pixel defining film, a pixel defining pattern, and a pattern according to an embodiment.

FIG. 9 is a plan view illustrating a pixel defining layer, a pixel defining pattern, and a pattern according to an embodiment. Specifically, FIG. 9 illustrates a pixel defining layer PDL, a pixel defining pattern PDP, and a pattern PSL disposed in a portion corresponding to a region AA' of FIG. 4.

Referring to FIGS. 7B and 9, the pixel defining layer PDL may be disposed in the second region DP-A2 and the third region DP-A3. The pixel defining layer PDL may not overlap the first region DP-A1. Since the pixel defining layer PDL having a black color is not disposed in the first region DP-A1, the light transmittance of the first region DP-A1 may be improved.

The pixel defining pattern PDP may be disposed in the first region DP-A1. The pixel defining pattern PDP may be provided in plurality, and the plurality of pixel defining patterns PDP may be disposed to be spaced apart from each other. For example, one pixel defining pattern PDP may have a shape that covers an edge of one first pixel electrode AE1. Accordingly, the pixel defining pattern PDP may have a circular ring shape when viewed in the thickness direction of the display panel 100, for example, when viewed from the third direction DR3.

In FIG. 9, one pixel defining pattern PDP is illustrated to have a circular ring shape as an example, but the shape of the pixel defining pattern PDP is not particularly limited thereto. For example, the pixel defining pattern PDP may be changed to various shapes, such as an angled ring shape, a ring shape having straight lines, a ring shape having straight lines and curves, and an irregular ring shape.

The pattern PSL may be disposed in the first region DP-A1. The pattern PSL may be provided in plurality, and the plurality of the patterns PSL may be disposed to be spaced apart from each other. For example, a portion of each of the plurality of patterns PSL may not overlap the pixel defining pattern PDP with respect to a plan view of the display panel. Accordingly, a portion of each of the plurality of patterns PSL may overlap the transmission region TA.

In FIG. 9, the pattern PSL is illustrated to have a circular shape, but the shape of the pattern PSL is not particularly limited thereto. For example, the pattern PSL may be changed to various shapes such as a polygon, an irregular shape having a straight line, and a curved shape.

Figure 10A:
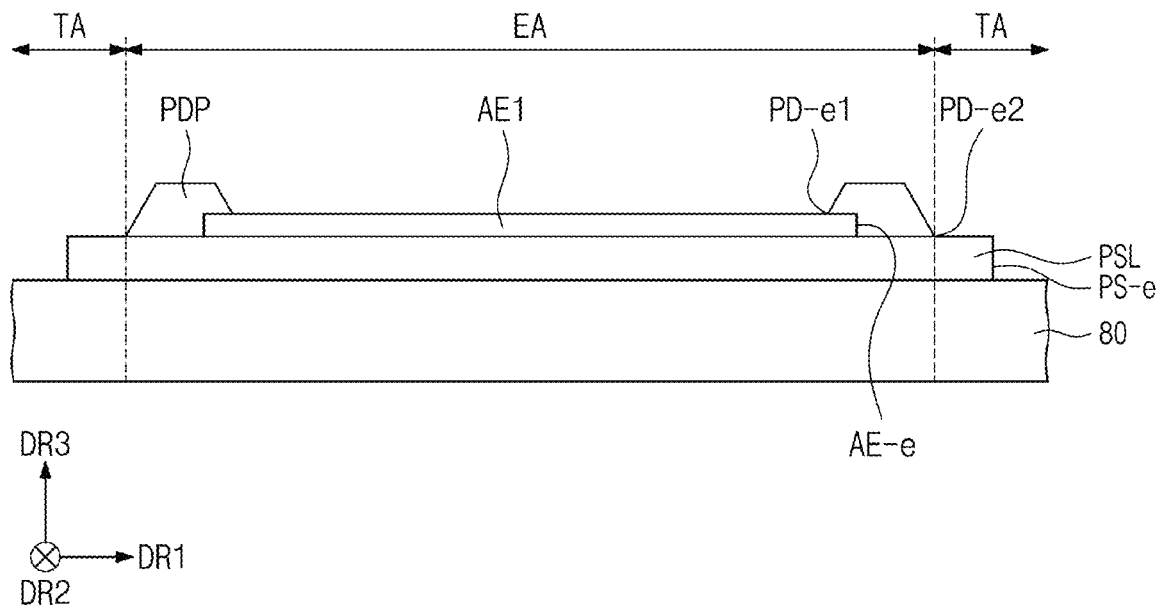
FIG. 10A is a cross-sectional view illustrating some components of a display module according to an embodiment.
Figure 10B:
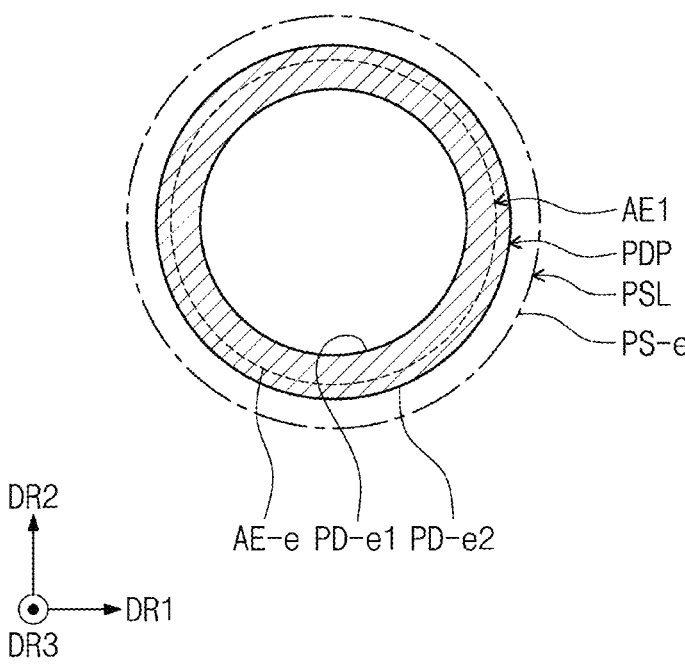
FIG. 10B is a plane view illustrating some components of a display module according to an embodiment.

FIG. 10A is a cross-sectional view illustrating some components of a display module according to an embodiment. FIG. 10B is a plane view illustrating some components of a display module according to an embodiment.

Referring to FIGS. 10A and 10B, the first pixel electrode AE1 may have a circular shape, the pixel defining pattern PDP may have a circular ring shape, and the pattern PSL may have a circular shape with respect to a plan view of the display panel. An edge AE-e of the first pixel electrode AE1, first and second edges PD-e1 and PD-e2 of the pixel defining pattern PDP, and an edge PS-e of the pattern PSL each may have a curve. In this case, diffraction of light passing through the transmission region TA may be minimized.

The pattern PSL may be disposed under the first pixel electrode AE1. A portion of the pattern PSL may be disposed between the first pixel electrode AE1 and the eighth insulating layer 80, and another portion of the pattern PSL may not overlap the first pixel electrode AE1. That is, the other portion of the pattern PSL may protrude more than the edge AE-e of the first pixel electrode AE1. The area of the pattern PSL may be larger than the area of the first pixel electrode AE1 with respect to a plan view of the display panel.

The first edge PD-e1 of the pixel-defining pattern PDP may overlap the first pixel electrode AE1, and the second edge PD-e2 of the pixel-defining pattern PDP may surround the first edge PD-e1 and overlap the pattern PSL. The edge PS-e of the pattern PSL may surround the second edge PD-e2.

According to an embodiment of the inventive concepts, the phase difference between the first light passing through the pattern PSL and the second light that does not pass through the pattern PSL may be closer to $(2n-1)\pi$ radians. Accordingly, the first light and the second light cancel may partially offset each other, and accordingly, diffraction patterns may be eliminated or reduced.

Figure 11A:
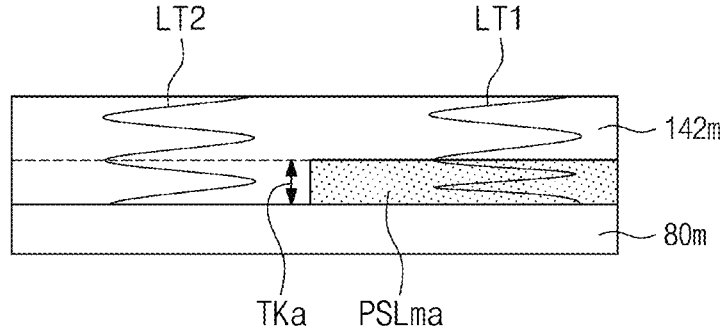
FIG. 11A is a diagram illustrating a simulation process for determining the thickness of a pattern.
Figure 11A:
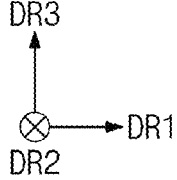

FIG. 11A is a diagram illustrating a simulation process for determining the thickness of a pattern.

FIG. 11A illustrates a first layer 80*m*, a pattern layer PSLma, and a second layer 142*m*. Referring to FIGS. 7B and 11A, the first layer 80*m* may be a layer having the same material as the eighth insulating layer 80, the pattern layer PSLma may be a layer having the same material as the pattern PSL, and the second layer 142*m* may be a layer having the same material as the organic layer 142.

The phase of the first light LT1 incident on the eighth insulating layer 80 after passing through the pattern layer PSLma and the phase of second light LT2 incident on the eighth insulating layer 80 without passing through the pattern layer PSLma may be different from each other. The first light LT1 may correspond to light incident on the circuit layer 120 after passing through the pattern PSL, and the second light LT2 may correspond to light incident on the circuit layer 120 without passing through the pattern PSL.

The pattern layer PSLma may include a material having a higher refractive index than the refractive index of the second layer 142m. For example, the second layer 142m may include an organic material and have a refractive index of about 1.53, and the pattern layer PSLma may include indium tin oxide and have a refractive index of about 2.08. The thickness TKa of the pattern layer PSLma may be derived by Equation 1 below.

$$\Delta\theta = 2\pi d(n1-n2)/\lambda \qquad \text{Equation 1:}$$

θ may be the phase difference between the first light LT1 and the second light LT2, d may be the thickness TKa of the pattern layer PSLma, n1 may be the refractive index of the pattern layer PSLma, n2 may be the refractive index of the second layer 142m, and λ may be the wavelength of a light source used in a simulation.

The wavelength of the light source used in the simulation may be selected from any one of a red light wavelength band, a green light wavelength band, or a blue light wavelength band. Diffraction of light may become larger as the wavelength is longer. That is, the ghost phenomenon caused by the diffraction may be mainly observed in the red wavelength band. According to an embodiment, the simulation may be performed in a wavelength band of red light.

For example, the thickness TKa of the pattern layer PSLma may be set to have a phase difference of about 180 degrees in a red light wavelength band. Accordingly, the difference between the phase of the first light LT1 and the phase of the second light LT2 may be closer to (2n−1)π radians when the first light and the second light each have a red light wavelength band than when the first light and the second light each have a green or blue light wavelength band.

Figure 11B:
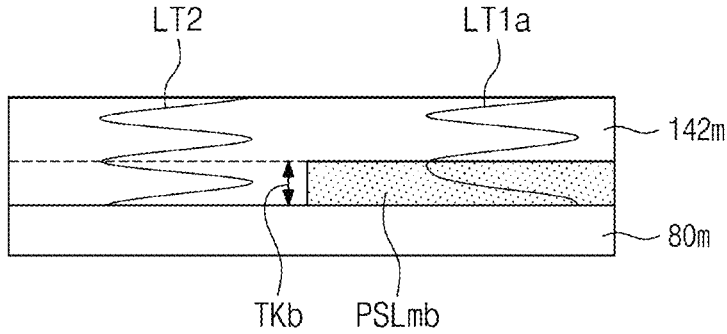
FIG. 11B is a diagram illustrating a simulation process for determining the thickness of a pattern.
Figure 11B:
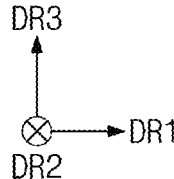

FIG. 11B is a diagram illustrating a simulation process for determining the thickness of a pattern.

FIG. 11B illustrates a first layer 80m, a pattern layer PSLmb, and a second layer 142m. Referring to FIGS. 7B and 11B, the first layer 80m may be a layer having the same material as the eighth insulating layer 80, the pattern layer PSLmb may be a layer having the same material as the pattern PSL, and the second layer 142m may be a layer having the same material as the organic layer 142.

The pattern layer PSLmb may include a material having a lower refractive index than the refractive index of the second layer 142m. For example, the second layer 142m may include an organic material and have a refractive index of about 1.53, and the pattern layer PSLmb may include silicon nitride and have a refractive index of about 1.4.

The thickness TKb of the pattern layer PSLmb may be determined such that the phase difference between the first light LT1a incident on the eighth insulating layer 80 after passing through the pattern layer PSLmb, and the phase of the second light LT2 incident on the eighth insulating layer 80 without passing through the pattern layer PSLma is closer to (2n−1)π radians.

Figure 12A:
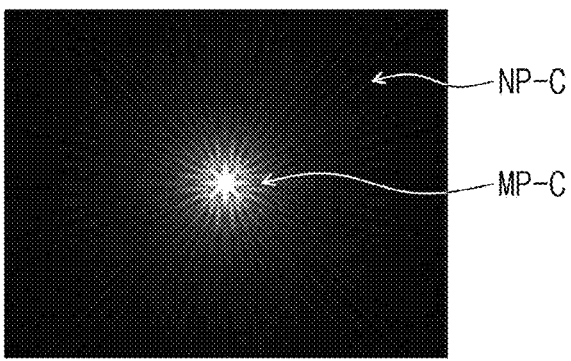
FIG. 12A is an image obtained by an electronic device according to a Comparative Example.
Figure 12B:
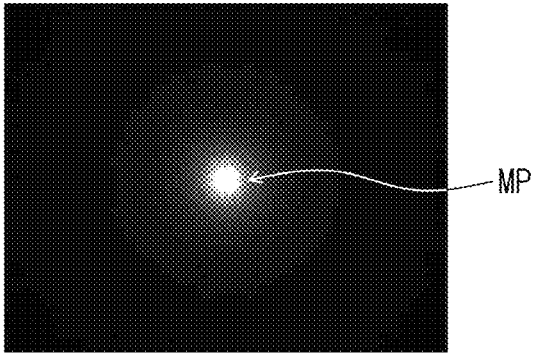
FIG. 12B is an image obtained by an electronic device according to an Example of the inventive concepts.

FIG. 12A is an image obtained by an electronic device according to Comparative Example, and FIG. 12B is an image obtained by an electronic device according to Example of the inventive concepts.

Referring to FIGS. 2, 12A and 12B, images, in which a single point light source photographed by the electronic module CM disposed under the display module DM, are shown in FIGS. 12A and 12B.

FIG. 12A is an image in which a point light source passing through the display module DM that does not include the pattern PSL (see FIG. 7B) is photographed, and FIG. 12B an image in which a point light source passing through the display module DM including the pattern PSL (see FIG. 7B) is photographed. FIGS. 12A and 12B each may be an image photographed by the electronic module CM.

Referring to FIG. 12A, in addition to a main image MP-C corresponding to the point light source, a noise image NP-C caused by the diffraction patterns was photographed. The noise image NP-C may be an image generated by the diffraction of light passing through the display module DM. Accordingly, the image quality of the image photographed by the electronic module CM may be deteriorated.

According to an embodiment of the inventive concepts, the pattern PSL is provided at an edge portion where the diffraction is increased, for example, at a boundary portion between the element region EA (see FIG. 7B) and the transmission region TA (see FIG. 7B). Accordingly, the phase difference between light passing through the pattern PSL and light that does not pass through the pattern PSL may become closer to about 180 degrees, and thus the diffraction pattern may be offset and eliminated. A main image MP in FIG. 12B may be clearer than the main image MP-C illustrated in FIG. 12A. In addition, compared with FIG. 12A, a noise image may be significantly reduced in the image shown in FIG. 12B. Accordingly, the quality of a signal obtained by the electronic module CM, for example, the image quality may be improved.

Figure 13A:
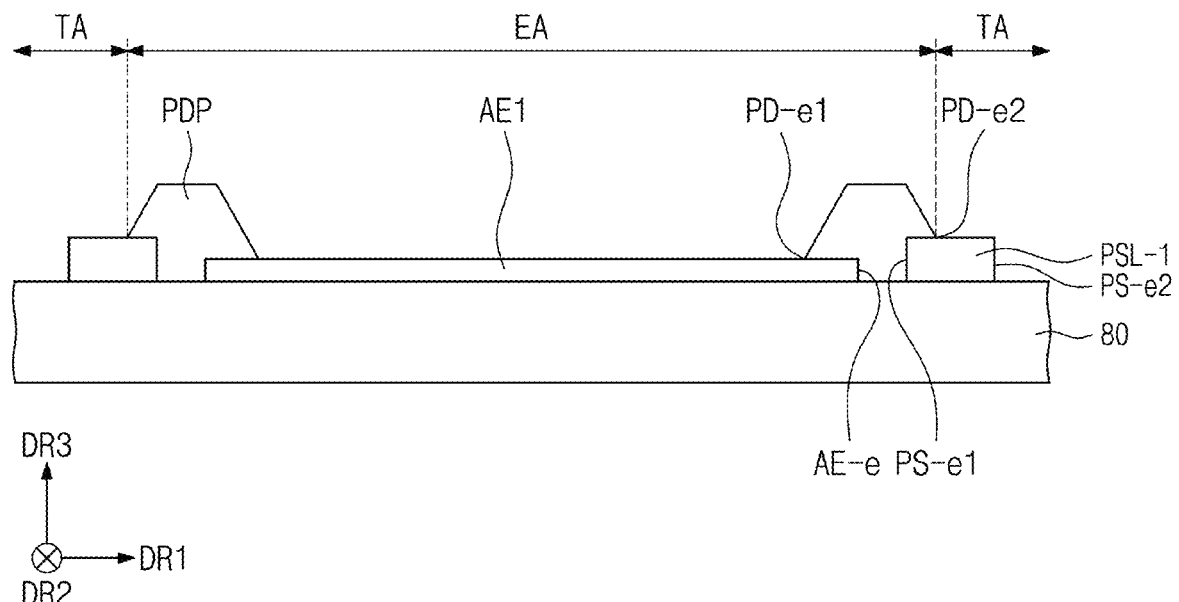
FIG. 13A is a cross-sectional view illustrating some components of a display module according to an embodiment.
Figure 13B:
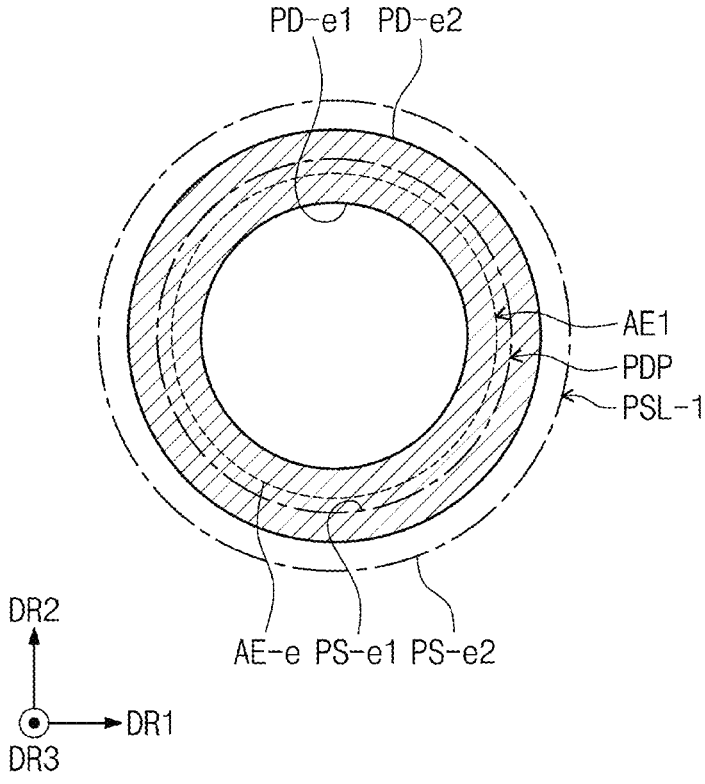
FIG. 13B is a plane view illustrating some components of a display module according to an embodiment.

FIG. 13A is a cross-sectional view illustrating some components of a display module according to an embodiment. FIG. 13B is a plane view illustrating some components of a display module according to an embodiment.

Referring to FIGS. 13A and 13B, the first pixel electrode AE1 has a circular shape, the pixel defining pattern PDP has a circular ring shape, and the pattern PSL-1 has a circular ring shape with respect to a plan view of the display panel. An edge AE-e of the first pixel electrode AE1, edges PD-e1 and PD-e2 of the pixel defining pattern PDP, and edges PS-el and PS-e2 of the pattern PSL-1 each may have a curve. In this case, diffraction of light passing through the transmission region TA may be minimized.

The pattern PSL-1 may be disposed in a region adjacent to the first pixel electrode AE1. The pattern PSL-1 may surround the first pixel electrode AE1. A portion of the pattern PSL-1 may be disposed between the pixel defining pattern PDP and the eighth insulating layer 80, and another portion of the pattern PSL-1 may not overlap the pixel defining pattern PDP.

According to an embodiment of the inventive concepts, the phase difference between the first light passing through the pattern PSL-1 and the second light that does not pass through the pattern PSL-1 may be closer to (2n−1)π radians. Accordingly, the first light and the second light may partially offset each other, and accordingly, diffraction patterns may be eliminated or reduced.

Figure 14A:
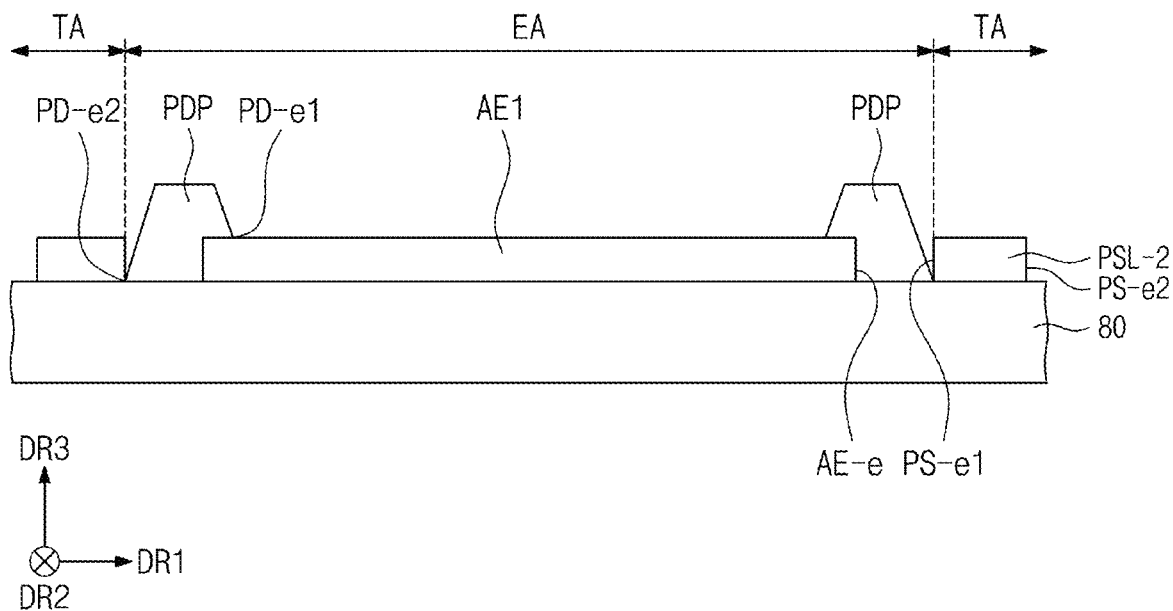
FIG. 14A is a cross-sectional view illustrating some components of a display module according to an embodiment.
Figure 14B:
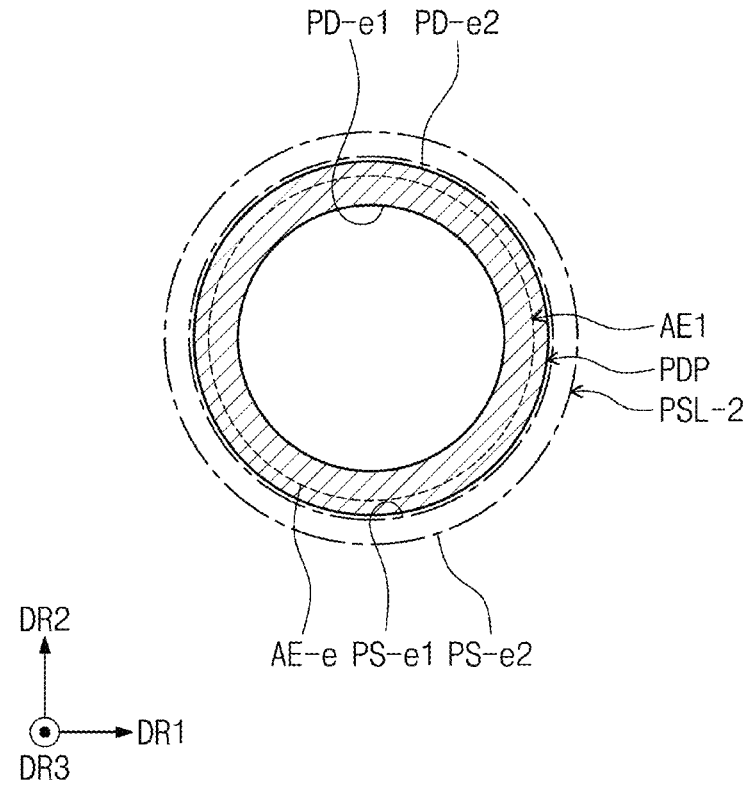
FIG. 14B is a plane view illustrating some components of a display module according to an embodiment.

FIG. 14A is a cross-sectional view illustrating some components of a display module according to an embodiment. FIG. 14B is a plane view illustrating some components of a display module according to an embodiment.

Referring to FIG. 14A and FIG. 14B, the first pixel electrode AE1 has a circular shape, the pixel defining pattern PDP has a circular ring shape, and the pattern PSL-2 has a circular ring shape with respect to a plan view of the display panel. An edge AE-e of the first pixel electrode AE1, edges PD-e1 and PD-e2 of the pixel defining pattern PDP, and edges PS-el and PS-e2 of the pattern PSL-2 each may have a curve. In this case, diffraction of light passing through the transmission region TA may be minimized.

The pattern PSL-2 may be disposed in a region adjacent to the first pixel electrode AE1. The pattern PSL-2 may surround the first pixel electrode AE1. The pattern PSL-2 may surround the pixel defining pattern PDP.

According to an embodiment of the inventive concepts, the phase difference between the first light passing through the pattern PSL-1 and the second light that does not pass through the pattern PSL-1 may be closer to $(2n-1)\pi$ radians. Thus, the first light and the second light may partially offset each other, and accordingly, diffraction patterns may be eliminated or reduced.

According to the abovementioned description, a pattern may be disposed between a circuit layer and a light-emitting element layer. At least a portion of the pattern may overlap a transmission region. Thus, a portion of light passing through the transmission region may pass through the pattern. The phase of first light passing through the pattern may differ from the phase of second light that does not pass through the pattern. The phase difference between the first light and the second light may be close to about 180 degrees. Thus, a portion of the first light and the second light may offset each other, and accordingly, diffraction patterns may be eliminated or reduced. Therefore, the quality of a signal, such as an image, obtained by the electronic module, can be improved.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:

a base layer;

a circuit layer disposed on the base layer;

a light-emitting element layer disposed on the circuit layer, and including a light-emitting element having a pixel electrode, a light-emitting element layer disposed on the pixel electrode, and a common electrode disposed on the light-emitting layer, and a pixel defining pattern disposed on the pixel electrode and having and having an opening defined therein to expose a portion of the pixel electrode;

an encapsulation layer disposed on the light-emitting element layer; and a pattern disposed between the circuit layer and the light-emitting element layer, wherein at least a portion of the pattern is disposed in a region adjacent to the light-emitting element, with respect to a plan view of the display panel, and the pixel defining pattern covers another portion of the pixel electrode that entirely overlaps the pattern.

2. The display panel of claim 1, wherein an area of the pattern is greater than an area of the pixel electrode.

3. The display panel of claim 2, wherein at least another portion of the pattern is disposed between the pixel electrode and the circuit layer.

4. The display panel of claim 1, wherein the circuit layer comprises an upper insulating layer in contact with the pattern, and a refractive index of the pattern and a refractive index of the upper insulating layer are different from each other.

5. The display panel of claim 1, wherein the encapsulation layer comprises an organic layer, and a refractive index of the pattern is different from a refractive index of the organic layer.

6. The display panel of claim 1, wherein the pattern comprises a transparent conductive oxide or an inorganic substance.

7. The display panel of claim 1, wherein a phase of first light incident on the circuit layer after passing through the pattern, and a phase of second light incident on the circuit layer without passing through the pattern, are different from each other.

8. The display panel of claim 7, wherein a difference between the phase of the first light and the phase of the second light is closer to $(2n-1)\pi$ radians when the first light and the second light each have a red-light wavelength band than when the first light and the second light each have a green-or blue-light wavelength band, n being a positive integer greater than or equal to one.

9. The display panel of claim 1, wherein the pattern protrudes from the pixel defining pattern, with respect to a plan view of the display panel.

10. The display panel of claim 9, wherein the pixel defining pattern comprises a first edge overlapping the pixel electrode, and a second edge overlapping the pattern while surrounding the first edge.

11. The display panel of claim 10, wherein an edge of the pattern surrounds the second edge.

12. The display panel of claim 1, wherein an element region in which the light-emitting element is disposed and a transmission region adjacent to the element region are defined in the light-emitting element layer, and at least a portion of the pattern is disposed in the transmission region.

13. The display panel of claim 12, wherein a portion of the transmission region does not overlap the pattern.

14. The display panel of claim 1, wherein an edge of the pixel electrode and an edge of the pattern each have a curve.

15. An electronic device comprising a display panel in which an auxiliary display region having an element region and a transmission region defined therein, and a main display region adjacent to the auxiliary display region are defined, wherein the display panel includes:

a base layer;

a circuit layer disposed on the base layer;

a phase shift pattern disposed on the circuit layer and disposed in the auxiliary display region;

a first light-emitting element disposed in the auxiliary display region and including a first pixel electrode disposed on the phase shift pattern; and a second light-emitting element disposed in the main display region and including a second pixel electrode disposed on the circuit layer, wherein the first pixel electrode overlaps the element region, and at least a portion of the phase shift pattern overlaps the transmission region, and an entire edge of the first pixel electrode is surrounded by the at least a portion of the phase shift pattern, with respect to a plan view of the display panel.

16. The electronic device of claim 15, wherein the phase shift pattern is disposed between the first pixel electrode and the circuit layer, and an area of the phase shift pattern is greater than an area of the first pixel electrode.

17. The electronic device of claim 15, wherein the circuit layer comprises an upper insulating layer in contact with the phase shift pattern, and a refractive index of the phase shift pattern and a refractive index of the upper insulating layer are different from each other.

18. The electronic device of claim 15, wherein a phase of first light incident on the circuit layer after passing through the phase shift pattern, and a phase of second light incident on the circuit layer without passing through the phase shift pattern, are different from each other, and a difference between the phase of the first light and the phase of the second light is closer to $(2n-1)\lambda$ radians when the first light and the second light each have a red-light wavelength band than when the first light and the second light each have a green-or blue-light wavelength band, n being a positive integer greater than or equal to one.

19. The electronic device of claim 15, further comprising an electronic module that overlaps the auxiliary display region.

20. The electronic device of claim 15, wherein:

the first pixel electrode is provided in plurality and the second pixel electrode is provided in plurality; and a distance between two first pixel electrodes which are most adjacent to each other among the plurality of the first pixel electrodes is greater than a distance between two second pixel electrodes which are most adjacent to each other among the plurality of the second pixel electrodes.

* * * * *